(12) United States Patent
Cho et al.

(10) Patent No.: US 8,941,164 B2
(45) Date of Patent: Jan. 27, 2015

(54) SEMICONDUCTOR DEVICES INCLUDING CAPACITOR SUPPORT PADS

(71) Applicants: Young-kyu Cho, Seongnam-si (KR); Ki-vin Im, Seongnam-si (KR); Yong-hee Choi, Yongin-si (KR)

(72) Inventors: Young-kyu Cho, Seongnam-si (KR); Ki-vin Im, Seongnam-si (KR); Yong-hee Choi, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/846,356

(22) Filed: Mar. 18, 2013

(65) Prior Publication Data
US 2013/0292796 A1 Nov. 7, 2013

Related U.S. Application Data

(63) Continuation of application No. 12/966,191, filed on Dec. 13, 2010, now Pat. No. 8,405,136, which is a continuation of application No. 12/137,634, filed on Jun. 12, 2008, now Pat. No. 7,871,891.

(30) Foreign Application Priority Data

Jun. 13, 2007 (KR) .......................... 10-2007-0057995

(51) Int. Cl.
*H01L 27/108* (2006.01)
*H01L 49/02* (2006.01)
*H01L 27/02* (2006.01)

(52) U.S. Cl.
CPC .......... *H01L 28/40* (2013.01); *H01L 27/10852* (2013.01); *H01L 27/0207* (2013.01); *H01L 28/91* (2013.01)
USPC ............................ 257/301; 257/532; 438/386

(58) Field of Classification Search
CPC ................... H01L 27/10829; H01L 27/10852; H01L 27/10858; H01L 27/10867; H01L 27/0207; H01L 28/40; H01L 28/91; H01L 27/10876; H01G 4/28; H01G 4/38
USPC ...................... 257/68, 71, 308, 906, E21.008, 257/E21.396, E21.651, 301, 532; 438/386–399
See application file for complete search history.

(56) References Cited

U.S. PATENT DOCUMENTS 6,436,760 B1 8/2002 Wong et al.
6,445,565 B1 9/2002 Toyoda et al.
(Continued)

FOREIGN PATENT DOCUMENTS

JP 2003-142605 5/2003
KR 10-2003-0075907 A 9/2003
(Continued)

OTHER PUBLICATIONS

Korean Notice to Submit Responde and English Translation to Korean Patent Application No. 10-2007-0057995 (8pages), dated Mar. 21, 2008.

*Primary Examiner* — Khiem D Nguyen
(74) *Attorney, Agent, or Firm* — Muir Patent Consulting, PLLC

(57) ABSTRACT

A semiconductor device may include a semiconductor substrate and a plurality of first capacitor electrodes arranged in a plurality of parallel lines on the semiconductor substrate with each of the first capacitor electrodes extending away from the semiconductor substrate. A plurality of capacitor support pads may be provided with each capacitor support pad being connected to first capacitor electrodes of at least two adjacent parallel lines of the first capacitor electrodes and with adjacent capacitor support pads being spaced apart. A dielectric layer may be provided on each of the first capacitor electrodes, and a second capacitor electrode may be provided on the dielectric layer so that the dielectric layer is between the second capacitor electrode and each of the first capacitor electrodes. Related methods are also discussed.

29 Claims, 28 Drawing Sheets

(56) References Cited

U.S. PATENT DOCUMENTS

| | | |
|---|---|---|
| 6,709,919 B2 * | 3/2004 | Tu ................................ 438/255 |
| 6,853,023 B2 | 2/2005 | Goebel et al. |
| 7,311,857 B2 | 12/2007 | Ko et al. |
| 7,314,795 B2 | 1/2008 | Yeo et al. |
| 7,387,939 B2 | 6/2008 | Manning |
| 2004/0110340 A1 | 6/2004 | Kim et al. |
| 2005/0051822 A1 * | 3/2005 | Manning ....................... 257/296 |
| 2005/0054159 A1 | 3/2005 | Manning et al. |
| 2005/0093046 A1 * | 5/2005 | Ahn ............................. 257/296 |
| 2006/0113633 A1 | 6/2006 | Park et al. |
| 2007/0045693 A1 * | 3/2007 | Manning et al. .............. 257/296 |
| 2008/0009119 A1 * | 1/2008 | Eto ............................... 438/386 |

FOREIGN PATENT DOCUMENTS

| | | |
|---|---|---|
| KR | 10-2005-0002358 A | 1/2005 |
| KR | 10-2005-0043406 A | 5/2005 |
| KR | 10-2006-0007727 A | 1/2006 |
| KR | 10-0885922 | 2/2009 |

\* cited by examiner

SEMICONDUCTOR DEVICES INCLUDING CAPACITOR SUPPORT PADS

RELATED PATENT APPLICATION

This application claims the benefit of priority as a continuation of U.S. application Ser. No. 12/966,191 filed Dec. 13, 2010, now U.S. Pat. No. 8,405,136, which is a continuation of U.S. application Ser. No. 12/137,634 filed Jun. 12, 2008 (now U.S. Pat. No. 7,871,891), which claims the benefit of Korean Patent Application No. 10-2007-0057995, filed on Jun. 13, 2007, in the Korean Intellectual Property Office. The disclosures of all of the above referenced applications are incorporated herein in their entireties by reference.

FIELD OF THE INVENTION

The present invention relates to electronics, and more particularly, to a semiconductor device including capacitors and related methods.

BACKGROUND

As the area occupied by various semiconductor elements in semiconductor devices such as a dynamic random access memories (DRAMs) has been reduced by increased integration, a cell capacitance should be maintained constant or increased. Some methods used to ensure a sufficient cell capacitance within a limited area include using a high dielectric material as a dielectric film, reducing a thickness of a dielectric film, and/or increasing an effective area of a lower electrode. Using a high dielectric material may require large investments such as the introduction of new equipment, assurance of reliability, mass-production of dielectric films, use of subsequent low temperature processes, etc. Accordingly, methods of increasing the effective area of a lower electrode may be relatively easy to realize because conventional dielectric films may be used.

Methods of increasing the effective area of the lower electrode may include approaches such as making three-dimensional lower electrodes such as cylindrical or fin shape lower electrodes, growing hemispherical grains (HSGs) on lower electrodes, and/or increasing the height of lower electrodes. When growing HSGs on lower electrodes a critical dimension (CD) between the lower electrodes may be difficult to secure. Because HSGs may be detached from the lower electrodes and may cause bridges between the lower electrodes, growing the HSGs may be difficult to apply to a semiconductor device having a design rule of 0.14 µm (micrometer) or less. Accordingly, a method of making lower electrodes into a three-dimensional shapes and increasing a height thereof has been used to increase cell capacitance. Lower electrodes may also be formed into a cylindrical or a stack shape.

In the case of cylindrical or stack type electrodes, both external and internal surfaces of the electrodes can be used, thereby increasing effective electrode surface areas. For cylindrical or stack type electrodes having an integrated one cylinder stack (OCS) structure, however, a height of the lower electrodes may be increased to ensure a capacitance greater than a certain level required for the operation of a semiconductor device. Thus, such electrodes may collapse or break before the deposition of a dielectric material.

One of the main reasons that lower electrodes may collapse is a surface tension of a cleaning liquid used in a cleaning liquid-drying process after wet etching of a mold oxide film. Expansion of the area of an electrode by conventional methods may be limited due to collapsing of the lower electrodes, and a method of forming supporting pads has been devised to address this problem.

Conventional supporting pads may be formed in the shape of a lattice, and when the lattice supporting pads are formed, the lower electrodes may be twisted because the supporting pads apply stress to the lower electrodes. In addition, a material used in a subsequent process may not be symmetrically and uniformly deposited because the interval between the lower electrodes may be too narrow due to the lattice support pads. Furthermore, the non-uniformly deposited subsequent materials may increase the stress applied to the lower electrodes.

Therefore, when the lower electrodes collapse, break, or are twisted due to the stress applied by the pads, bridges or leakages may be caused between cells, thereby causing defects in semiconductor devices.

Meanwhile, in conventional semiconductor devices having an OSC structure, a plate electrode and a metal plug may be formed after a capacitor is formed. In order to form the metal plug, a planarization process may be used after an oxide film having a thickness greater than an OCS level difference is deposited. Thus, the oxide film may need to be deposited up to 30,000 Å (Angstroms) or more according to the height of the OSC structure, and then an excess chemical mechanical polishing (CMP) process may be performed to remove the level difference of the oxide film after the deposition process. That is, an excess CMP process may be used to thin the deposited oxide film by about 3,000 to 4,000 Å (Angstroms). Accordingly, a distribution of CMP slurry (quantity) on the water may deteriorate, and the thickness of the oxide film after the CMP process is performed may not be sufficiently uniform. The non-uniform thickness of the oxide film may cause open CD distribution deterioration during an etch used to form subsequent metal plugs, thereby decreasing product yield.

SUMMARY

According to some embodiments of the present invention, a semiconductor device may include a semiconductor substrate, and a plurality of first capacitor electrodes arranged in a plurality of parallel lines on the semiconductor substrate with each of the first capacitor electrodes extending away from the semiconductor substrate. A plurality of capacitor support pads may be provided with each capacitor support pad being connected to first capacitor electrodes of at least two adjacent parallel lines of the first capacitor electrodes and with adjacent capacitor support pads being spaced apart. A dielectric layer may be provided on each of the first capacitor electrodes, and a second capacitor electrode may be provided on the dielectric layer so that the dielectric layer is between the second capacitor electrode and each of the first capacitor electrodes.

Each of the first capacitor electrodes may include inner and outer sidewalls, and the inner sidewalls of a first capacitor electrode may define a volume open only at an end of the first capacitor electrode opposite the substrate. Moreover, each of the first capacitor electrodes may include a cylindrical capacitor electrode. The first capacitor electrodes may be arranged in a zigzag pattern so that first capacitor electrodes of adjacent ones of the parallel lines are offset in a direction perpendicular with respect to the parallel lines. The first capacitor electrodes may be arranged in rows and columns so that first capacitor electrodes of adjacent ones of the parallel lines are aligned in a direction perpendicular with respect to the parallel lines. The plurality of first capacitor electrodes may be arranged on a cell region of the semiconductor substrate, and each of the capacitor support pads may extend to adjacent an edge of the cell region. The cell region of the semiconductor substrate may be surrounded by a peripheral region of the semiconductor substrate, and at least two adjacent capacitor support pads may be connected adjacent to the edge of the cell region.

The dielectric layer and the second capacitor electrode may be provided on portions of the first capacitor electrodes between the capacitor support pads and the semiconductor substrate, and the capacitor support pads may include an electrically insulating material. More particularly, the capacitor support pads may include a material selected from the group consisting of SiN, SiCN, TaO, and/or $TiO_2$, and the capacitor support pads may have a thickness in the range of about 500 Angstroms to about 1,500 Angstroms.

A mold oxide layer may be provided on portions of the substrate between the first capacitor electrodes, and the dielectric layer and the second capacitor electrode may be on portions of the first capacitor electrodes between the capacitor support pads and the semiconductor substrate. The plurality of first capacitor electrodes may be arranged on a cell region of the semiconductor substrate, and a guard ring may surround the cell region of the semiconductor substrate with the guard ring and the first capacitor electrodes being formed of a same material. The semiconductor substrate may include a cell region and a peripheral region outside the cell region, and the plurality of first capacitor electrodes may be arranged on the cell region of the semiconductor substrate. A guard ring may be provided outside the cell region, and a mold oxide layer may be provided on the peripheral region of the semiconductor substrate adjacent to the guard ring. An external support pad may be provided on the mold oxide layer so that the mold oxide layer is between the external support pad and the substrate, and the external support pad and the capacitor support pads may be formed of a same material. Moreover, the external support pad may be adjacent an end of the guard ring opposite the semiconductor substrate.

The guard ring and the external support pad may surround the cell region, and the capacitor support pads and the external support pad may have a thickness in the range of about 500 to about 1,500 Angstroms. The guard ring and the first capacitor electrodes may extend approximately a same distance away from a surface of the semiconductor substrate. An SiGe plate electrode layer may be provided on the second capacitor electrode, and the SiGe plate electrode layer may have a thickness in the range of about 1,000 to about 2,000 Angstroms. A planarization oxide layer may be provided on the SiGe plate electrode layer and on the mold oxide layer, and a thickness of the planarization oxide layer may be about 5,000 Angstroms or less. Moreover, the guard ring may be spaced no more than about 4,000 Angstroms from portions of the second capacitor electrode on outermost ones of the first capacitor electrodes.

According to other embodiments of the present invention, a method of forming a semiconductor memory device may include forming a mold oxide layer on a semiconductor substrate including a cell region and a peripheral region outside the cell region. A support pad layer may be formed on the mold oxide layer so that the mold oxide layer is between the support pad layer and the semiconductor substrate. The support pad layer and the mold oxide layer may be patterned to provide an array of holes in the support pad layer and the mold oxide layer on the cell region of the semiconductor substrate, and the array of holes may be arranged in a plurality of parallel lines with each of the lines defined by a plurality of the holes. A plurality of first capacitor electrodes may be formed with each of the first capacitor electrodes being formed along sidewalls of a respective one of the holes so that the first capacitor electrodes are arranged in a plurality of parallel lines with each of the lines including a plurality of the first capacitor electrodes. Portions of the support pad layer may be selectively removed to define a plurality of capacitor support pads with each capacitor support pad being connected to first capacitor electrodes of at least two adjacent parallel lines of the first capacitor electrodes, and adjacent capacitor support pads may be spaced apart. At least portions of the mold oxide layer may be removed from sidewalls of the first capacitor electrodes while maintaining the capacitor support pads.

A dielectric layer may be formed on each of the first capacitor electrodes, and a second capacitor electrode may be formed on the dielectric layer so that the dielectric layer is between the second capacitor electrode and each of the first capacitor electrodes. Forming the dielectric layer may include forming the dielectric layer on each of the first capacitor electrodes and on opposing surfaces of the support pad layer facing toward and away from the semiconductor substrate. Forming the second capacitor electrode on the dielectric layer may include forming the second capacitor electrode on the dielectric layer and on opposing surfaces of the support pad layer facing toward and away from the semiconductor substrate.

The holes may be arranged in a zigzag pattern so that the holes of adjacent ones of the parallel lines are offset in a direction perpendicular with respect to the parallel lines, or the holes may be arranged in rows and columns so that the holes of adjacent ones of the parallel lines are aligned in a direction perpendicular with respect to the parallel lines. The plurality of holes may be formed on a cell region of the semiconductor substrate, and each of the capacitor support pads may extend adjacent to an edge of the cell region. At least two adjacent capacitor support pads may be connected adjacent to the edge of the cell region. Removing at least portions of the mold oxide layer may include removing at least portions of the mold oxide layer from sidewalls of the first capacitor electrodes while maintaining portions of the mold oxide layer between portions of the first capacitor electrodes adjacent the semiconductor substrate.

Forming the plurality of first capacitor electrodes may include depositing a conductive layer on the support pad layer and on sidewalls of the holes through the support pad layer and the mold oxide layer. An insulating layer may be formed on the conductive layer, and portions of the insulating layer and the conductive layer may be removed from surface portions of the support pad layer so that the surface portions of the support pad layer are exposed while portions of the conductive layer are maintained on the sidewalls of the holes.

Removing portions of the mold oxide layer may include removing at least portions of the mold oxide layer from sidewalls of the first capacitor electrodes while maintaining the capacitor support pads so that a void is defined between portions of the capacitor support pads and the semiconductor substrate. The support pad layer and the mold oxide layer may include different materials and removing at least portions of the mold oxide layer may include selectively removing at least portions of the mold oxide layer using a lift-off process while maintaining the capacitor support pads.

Patterning the support pad layer and the mold oxide layer may further include patterning the support pad layer and the mold oxide layer to provide a trench in the support pad layer and the mold oxide layer surrounding the cell region, and a guard ring may be formed in the trench with the guard ring and the first capacitor electrodes being formed of a same material. A thickness of the guard ring in a direction parallel with respect to a surface of the semiconductor substrate may be no more than twice a thickness of a portion of one of the first capacitor electrodes on a sidewall of a respective one of the holes.

Selectively removing portions of the support pad layer may include selectively removing portions of the support pad layer to define an external support pad on the mold oxide layer outside the guard ring. Removing at least portions of the mold oxide layer may include removing at least portions of the mold oxide layer from sidewalls of the first capacitor electrodes while maintaining portions of the mold oxide layer outside the guard ring between the external support pad and the semiconductor substrate.

A dielectric layer may be formed on each of the first capacitor electrodes and on the external support pad outside the guard ring. A second capacitor electrode may be formed on the dielectric layer so that the dielectric layer is between the second capacitor electrode and each of the first capacitor electrodes and between the second capacitor electrode and the external support pad outside the guard ring. A plate electrode may be formed on the second capacitor electrode, and portions of the plate electrode, the second capacitor electrode, and the dielectric layer outside the guard ring may be selectively removed so that portions of the mold oxide layer outside the guard ring are exposed. After selectively removing portions of the plate electrode, the second capacitor electrode, and the dielectric layer, a planarization oxide layer may be formed on the plate electrode and on the exposed portions of the mold oxide layer outside the guard ring. In addition, a metal plug may be formed through the planarization oxide layer with the metal plug being electrically connected to the plate electrode. Moreover, the planarization oxide layer may have a thickness of 5,000 Angstroms or less.

According to still other embodiments of the present invention, a method of forming a semiconductor device may include forming a plurality of first capacitor electrodes arranged in a plurality of parallel lines on the semiconductor substrate with each of the first capacitor electrodes extending away from the semiconductor substrate. A plurality of capacitor support pads may be formed with each capacitor support pad being connected to first capacitor electrodes of at least two adjacent parallel lines of the first capacitor electrodes, and adjacent capacitor support pacts may be spaced apart. A dielectric layer may be formed on each of the first capacitor electrodes, and a second capacitor electrode may be formed on the dielectric layer so that the dielectric layer is between the second capacitor electrode and each of the first capacitor electrodes.

Embodiments of the present invention may provide semiconductor devices including a capacitor having support pads so that stress caused by the support pads and applied to lower electrodes can be reduced and subsequent materials can be symmetrically and uniformly deposited by providing a space between lower electrodes.

Embodiments of the present invention may also provide semiconductor devices including capacitors and methods of fabricating semiconductor devices, in which a CMP process can be reduced when forming metal plugs or the CMP process can be omitted.

According to some embodiments of the present invention, a semiconductor device may include a semiconductor substrate in which a cell region is defined. A plurality of capacitors may include a plurality of cylindrical lower electrodes formed on the cell region and arrayed in rows or columns, dielectric films formed on the lower electrodes, and upper electrodes formed on the dielectric films. A plurality of capacitor support pads may be formed in stripes between the lower electrodes, with each capacitor support pad connecting a pair of neighboring rows, columns, or diagonal lines of the lower electrodes.

The capacitor support pads may be formed to extend to cell block edges forming boundary portions of the cell region or to extend to a peripheral region or a core region arranged outside of the cell region. In addition, two, three, or more of the capacitor support pads may be connected to each other at the cell block edge.

The capacitor support pads can be formed of a material having etching selectivity which is different from that of a mold oxide film used to form the lower electrodes, and may have a thickness in the range of 500 to 1,500 Å (Angstroms). For example, when the mold oxide film is formed of any one of $SiO_2$, SiGe, Si, and a carbonaceous material, the capacitor support pad may be formed of any one material of SiN, SiCN, TaO, and $TiO_2$ which may have a low etch rate with respect to LAL (low ammonium fluoride liquid) and which may provide dielectric properties. LAL etchants are discussed, by way of example in U.S. Pat. No. 7,314,795 to Yeo et al. and in U.S. Pat. No. 7,311,857.

Collapsing of the lower electrodes may be reduced by the mold oxide film having a predetermined thickness under the dielectric film between the lower electrodes.

The semiconductor device may include a guard ring formed outside of the cell region. The guard ring may surround the cell region, and a vertical cross section of the guard ring may be the same as a cross section of the lower electrodes or a side cross section of the lower electrodes. The guard ring may be formed within a distance of 4,000 Å (Angstroms) or less from the outermost capacitors of the cell region.

Meanwhile, external support pads may be formed in the peripheral region or the core region outside of the guard ring, and the mold oxide film may be maintained under the external support pads. Accordingly, the semiconductor device may include a planarization oxide film on the mold oxide film, and a thickness of the planarization oxide film may be 5,000 Å (Angstroms) or less.

According to other embodiments of the present invention, a semiconductor device may include a semiconductor substrate in which a cell region, and a peripheral region or a core region arranged outside of the cell region are defined. A plurality of capacitors may include a plurality of cylindrical lower electrodes formed on the cell region and arrayed in rows or columns, dielectric films formed on the lower electrodes, and upper electrodes formed on the dielectric films. A plurality of capacitor support pads may be formed in stripes between the lower electrodes, with each capacitor support pad connecting a pair of rows, columns, or diagonal lines of the lower electrodes. A guard ring may be formed outside of the cell region, and external support pads may be formed at a portion of the upper ends of a mold oxide film of the peripheral region or the core region using the same material used to form the capacitor support pads.

According to still other embodiments of the present invention, a method of fabricating a semiconductor device may include preparing a semiconductor substrate in which a cell region, and a peripheral region (or core region) arranged outside of the cell region are defined. A mold oxide film may be formed on the whole surface of the semiconductor substrate. A support pad film may be formed on the mold oxide film, and the mold oxide film and the support pad film may be etched to form a plurality of holes which are arrayed in a plurality of rows or columns and expose conductive areas formed on the cell region. A plurality of cylindrical lower electrodes which are arrayed in rows and columns may be formed by depositing a conductive material on inner walls of the holes. A plurality of capacitor support pads may be formed in stripes between the lower electrodes, with each capacitor support pad connecting a pair of adjacent rows, columns, or diagonal lines of the lower electrodes by etching the support pad film according to a predetermined pattern. Dielectric films and upper electrodes may be formed on the lower electrodes and the capacitor support pads.

A plurality of cylindrical lower electrodes may be formed by applying a conductive material on inner walls of the holes and the support pad film to form a conductive film. An oxide film may be formed on the conductive film, and planarization may be performed to expose the support pad film using a chemical mechanical polishing (CMP) process to separate the conductive films from each other. In addition, dielectric films and upper electrodes may be formed by etching and removing the oxide film and the mold oxide film, forming dielectric films on the lower electrodes and the support pad, and forming upper electrodes on the dielectric films.

Meanwhile, a hole for a guard ring surrounding the cell region may be formed during formation of a plurality of holes, and the guard ring may be formed by depositing a conductive material in the hole for a guard ring when forming the plurality of cylindrical lower electrodes. The guard ring may have a side cross section of the lower electrodes by forming the hole for the guard ring to have a relatively narrow width, or the guard ring and the lower electrodes may be formed to have a same cross section by forming the hole for the guard ring to have a relatively wide width.

When forming capacitor support pads, external support pads may be formed on the mold oxide film of the peripheral region or the core region by maintaining the support pad film on the mold oxide film of the peripheral region or the core region. A lower portion of the mold oxide film protected by the external support pads may be maintained during the operation of etching and removing the oxide layer and the mold oxide film. In addition, a layer of the mold oxide film with a reduced thickness may remain between the lower electrodes after etching of the oxide layer and the mold oxide film.

The method may further include forming a plate electrode film on the upper electrodes after the upper electrodes are formed, and exposing the mold oxide film of the peripheral region or the core region by etching a portion of the peripheral region or the core region. A planarization oxide film may be formed on the plate electrode film and exposed mold oxide film, and a metal plug connected to the plate electrode film may be formed by forming a contact on the planarization oxide film. A thickness of the upper oxide layer may be 5,000 Å (Angstroms) or less, and thus the upper oxide layer may not affect planarization.

The support pads supporting the lower electrodes may be formed in stripes between the lower electrodes, with each support pad connecting a pair of neighboring rows, columns, or diagonal lines of the lower electrodes. Accordingly, stress of the support pads applied to the lower electrodes may be reduced. In addition, a space between the lower electrodes can be increased, and thus subsequent materials such as a material for the dielectric film may be symmetrically and uniformly deposited. Thus, a semiconductor device having improved electrical characteristics may be provided.

The mold oxide film may be maintained under the external support pads by forming the guard ring and the external support pads outside of the cell region. Accordingly, problems caused by an excess CMP process may be reduced by depositing a thin oxide film during a metal plug process, or the CMP process may not be performed at all.

BRIEF DESCRIPTION OF THE DRAWINGS

The above and other features and advantages of the present invention will become more apparent by describing in detail examples of embodiments thereof with reference to the attached drawings in which.

DETAILED DESCRIPTION OF THE INVENTION

Figure 1:
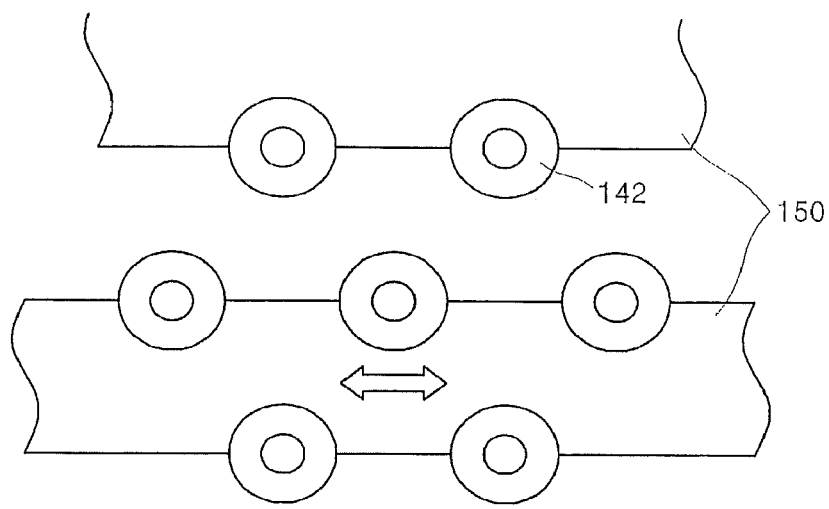
FIG. 1 is a plan view of lower electrodes of a cylindrical capacitor in which support pads are formed in stripes according to some embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIG. 1 is a plan view of lower electrodes of a cylindrical capacitor in which support pads are formed in stripes according to some embodiments of the present invention.

Referring to FIG. 1, in a semiconductor device including a capacitor, capacitor support pads 150 supporting the lower electrodes 142 may be formed in stripes. For example, the lower electrodes 142 may be arrayed in a plurality of rows and columns, and the capacitor support pads 150 may be formed in stripes between the lower electrodes 142, so that each capacitor support pad connects a pair of neighboring rows or columns of the lower electrodes 142.

Because the capacitor support pads 150 are formed in stripes between the lower electrodes 142, stress caused by the support pads may only be applied in a direction indicated by arrows as shown in FIG. 1, and thus stress applied to the lower electrodes 142 can be reduced compared to the case of conventional lattice type support pads. In addition, because a relatively wide space is provided between the lower electrodes 142 where the capacitor support pads 150 are not formed (that is, the pitch between the lower electrodes 142 is increased) subsequent materials can be relatively uniformly deposited on the lower electrodes 142 in subsequent processes and the deposition(s) can be more uniformly performed by forming symmetric support pads.

In addition, because the capacitor support pads 150 are formed in stripes, an exposure process used to form a pattern of the capacitor supporting pads 150 can be performed more easily. That is, because a photoresist (PR) pattern for a stripe-shaped pattern may be less complicated than a PR pattern for a conventional lattice pattern and because the size of the stripe-shaped pattern may be greater than that of the lattice pattern, the PR pattern for the stripe-shaped capacitor support pads may be formed relatively easily using the exposure process.

The stripe-shaped capacitor support pads 150 are shown in a row direction in the drawings, but the capacitor support pads 150 may also be formed in a column direction. In addition, the lower electrodes 142 may be arranged in a zigzag pattern to increase space. Thus, the lower electrodes 142 may be aligned in diagonal lines, and the capacitor support pads 150 may also be formed in stripes between the lower electrodes 142 by connecting a pair of diagonal lines of the lower electrodes 142.

The capacitor support pads 150 may thus have a stripe structure connecting a pair of neighboring rows, columns, or diagonal lines of the lower electrodes 142 in a cell region, which may be advantageous in an exposure processes and to maintain a pattern symmetry of the capacitor support pads 150.

FIGS. 2A to 2D are plan views of semiconductor devices illustrating array patterns of support pads according to some embodiments of the present invention.

Figure 2A:
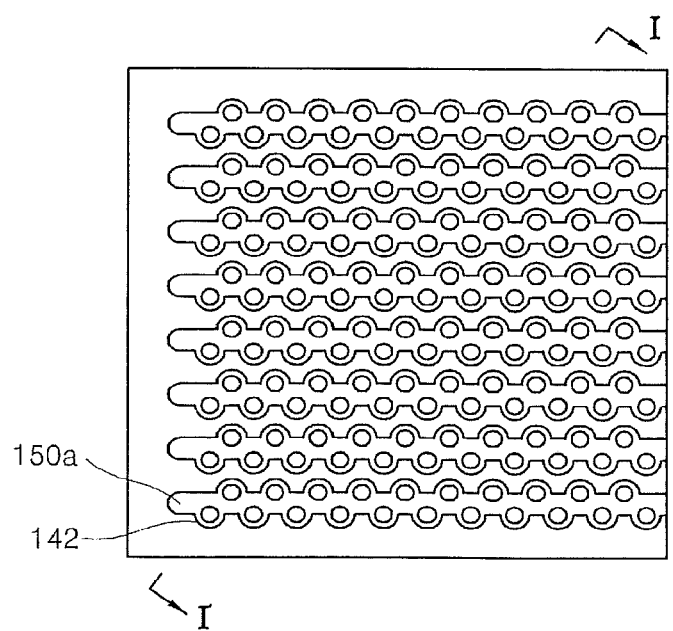
FIGS. 2A to 2D are plan views of semiconductor devices illustrating array patterns of the support pads according to some embodiments of the present invention.

FIG. 2A is a plan view of a semiconductor device according to some embodiments of the present invention showing a pattern of support pads. In the semiconductor device of FIG. 2A, support pads 150a may be formed in stripes in a row direction and aligned to form a plurality of rows. A pair of lines of the lower electrodes 142 may be supported by one of the support pads 150a. Meanwhile, the support pad 150a may extend to cell block edges forming boundary portions of the cell region in consideration of an amount of support pad materials that melt during wet etching of a mold oxide film performed when the lower electrodes 142 are formed.

Figure 2B:
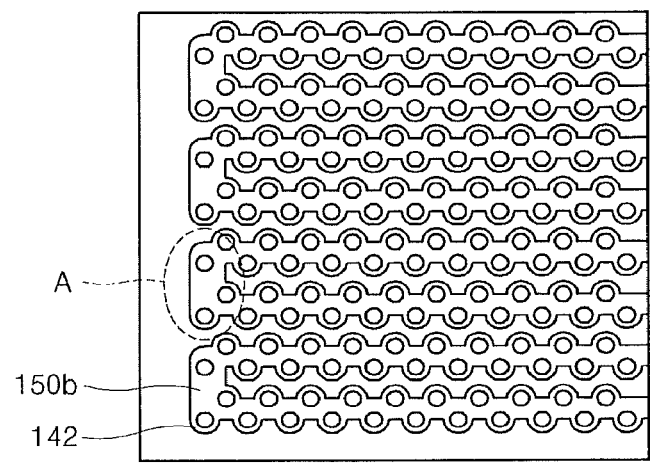

FIG. 2B is a plan view of a semiconductor device according to other embodiments of the present invention showing a pattern of support pads. The array pattern of support pads 150*b* formed in stripes may be similar to that of FIG. 2A, but two of the support pads 150*b* formed in stripes may be connected to each other at cell block edge A.

Figure 2C:
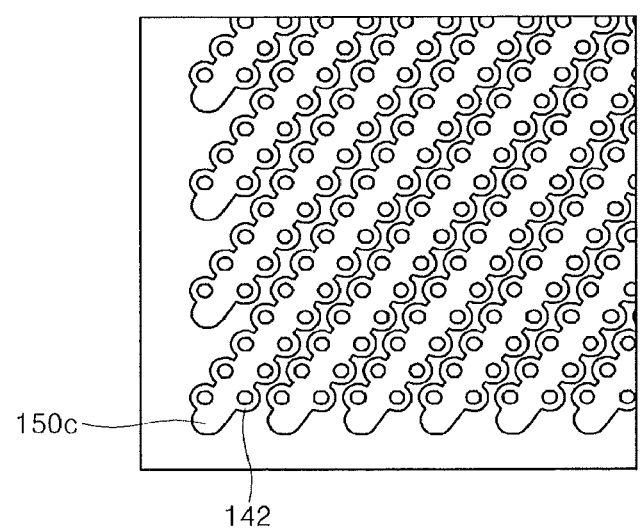

FIG. 2C is a plan view of a semiconductor device according to still other embodiments of the present invention showing a pattern of support pads. In the semiconductor device of FIG. 2C, the support pads 150*c* may be formed in stripes in a diagonal direction and aligned to form a plurality of diagonal lines. Meanwhile, the support pad 150*c* may extend to cell block edges in consideration of an amount of support pad materials that melt during wet etching of a mold oxide film as described above.

Figure 2D:
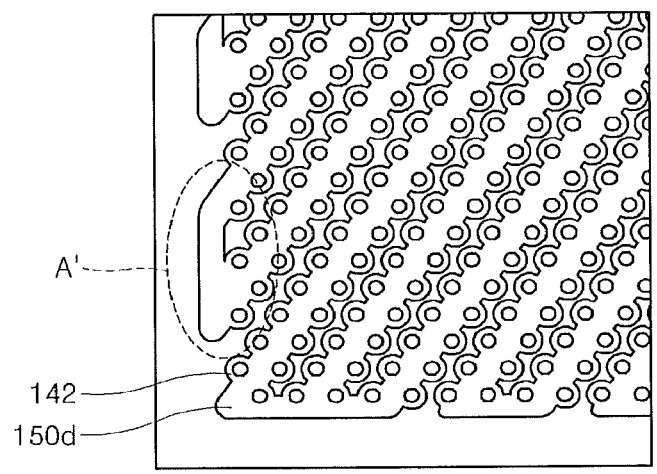

FIG. 2D is a plan view of a semiconductor device according to yet other embodiments of the present invention showing a pattern of support pads. The array pattern of support pads 150*d* may be formed in stripes similar to that of FIG. 2C, but two of the support pads 150*d* may be connected to each other at the cell block edge A'. Although two of the support pads 150*b* and 150*d* are connected to each other at the cell block edge as shown in FIGS. 2B and 2D, all of the support pads 150*b* or 150*d* or three or more of the support pads 150*b* or 150*d* may be connected to each other at the cell block edge.

A variety of patterns of support pads are shown in FIGS. 2A to 2D. Among them, the semiconductor devices of FIGS. 2A and 2C may provide better electrical characteristics, which are described with reference to FIG. 12. In addition, support pads aligned in diagonal lines instead of rows or columns may advantageously provide space between the lower electrodes and may maintain symmetry during deposition of subsequent materials. That is, the array of the support pads 150*c* formed in stripes as shown in FIG. 2C may provide the most advantageous structure of the structures shown in FIGS. 2A to 2D. Meanwhile, although the support pads shown in FIGS. 2A to 2D are aligned in rows and diagonal lines, support pads aligned in columns may also be used.

Figure 3:
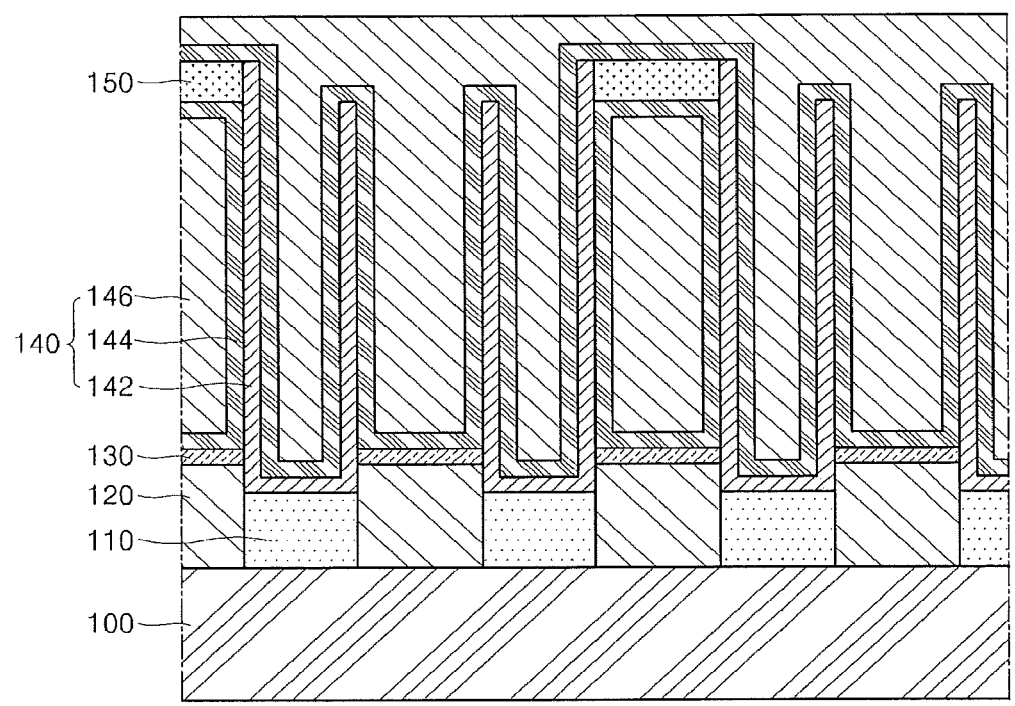
FIG. 3 is a cross-sectional view taken along the line I-I of FIG. 2A illustrating semiconductor devices including cylindrical capacitors in which support pads are formed.

FIG. 3 is a cross-sectional view taken along section line I-I of FIG. 2A illustrating a cross-sectional view of a semiconductor device including cylindrical capacitors and support pads. Referring to FIG. 3, the semiconductor device may include a semiconductor substrate 100, a cylindrical capacitor 140 formed on the semiconductor substrate 100, and a support pad 150 supporting lower electrodes 142 of the cylindrical capacitor 140.

The semiconductor substrate 100 may include a cell region and a peripheral region or a core region arranged outside of the cell region, but only the cell region is shown for the convenience of description. Contact lines 110 may be connected to conductive regions of the cell region and inter-layer insulation films 120 may be formed on the semiconductor substrate 100. The contact lines 110 may be formed as a layer electrically connecting conductive substrate regions of the cell region (such as source/drain regions of respective memory cell access transistions) with the lower electrodes 142 of the capacitors 140, and may be, for example, storage node contact plugs.

Each capacitor 140 including the cylindrical lower electrode 142, the dielectric film 144, and the upper electrode 146 may be disposed on a respective contact line 110. Generally, the cylindrical lower electrode 142 may be formed to have a height of 10,000 Å (Angstroms) or greater, and an aspect ratio thereof may be increased. Therefore, a method of forming support pads may be provided to reduce collapse of the lower electrodes 142 as described above. An etch stop film 130 may be formed of silicon nitride (SiN) or the like.

The support pads 150 may be formed at a portion of upper ends of and between the lower electrodes 142, and the stripe-shaped support pads 150 may be aligned in various directions as described in embodiments of the present invention shown in FIGS. 2A to 2D. The support pads 150 may be formed of a material having an etching selectivity which is different from that of a mold oxide film that is used to form the lower electrodes 142, and the support pads 150 may have dielectric characteristics. In addition, the support pads 150 may have a relatively low etch rate with respect to LAL when an LAL lift-off process is used to remove the mold oxide film. For example, the support pads 150 may be formed of any one of SiN, SiCN, TaO, and/or $TiO_2$, but the support pad material is not limited thereto. Meanwhile, the support pads 150 may have a thickness in the range of 500 to 1,500 Å (Angstroms) to stably support the lower electrodes 142, but the thickness thereof is not limited thereto.

Because the support pads 150 are formed in stripes between the lower electrodes 142, the dielectric film 144 may be symmetrically and uniformly formed on the entire surface of the lower electrodes 142 including upper and lower surfaces of the support pads 150, and the upper electrodes 146 can also be uniformly formed. Thus, stress applied to the lower electrodes 142 may be reduced as compared to the case of conventional lattice type support pads. Deterioration of electrical characteristics caused by asymmetrical and non-uniform deposition of subsequent materials may also be reduced.

Heights of portions of the lower electrodes 142 on which the support pad 150 is not formed may be less than that of portions of the lower electrodes 142 on which the support pad 150 is formed because portions of the lower electrodes 142 may be etched and removed when the support pad 150 is etched when patterning the stripe-shaped support pads 150. However, if desired, the support pads 150 may be selectively etched using proper etching.

In addition, a part of the mold oxide film, for example, up to a thickness of 1,000 to 2,000 Å (Angstroms), may remain between lower portions of the lower electrodes 142 when the mold oxide film is etched to further reduce collapse of the lower electrodes 142.

FIGS. 4A to 4F are cross-sectional views of semiconductor device structures illustrating methods of fabricating semiconductor devices including capacitors according to some embodiments of the present invention, and FIGS. 5A to 5D are plan views of the semiconductor device structures shown in FIGS. 4B, 4C, 4D and 4E, respectively.

Figure 4A:
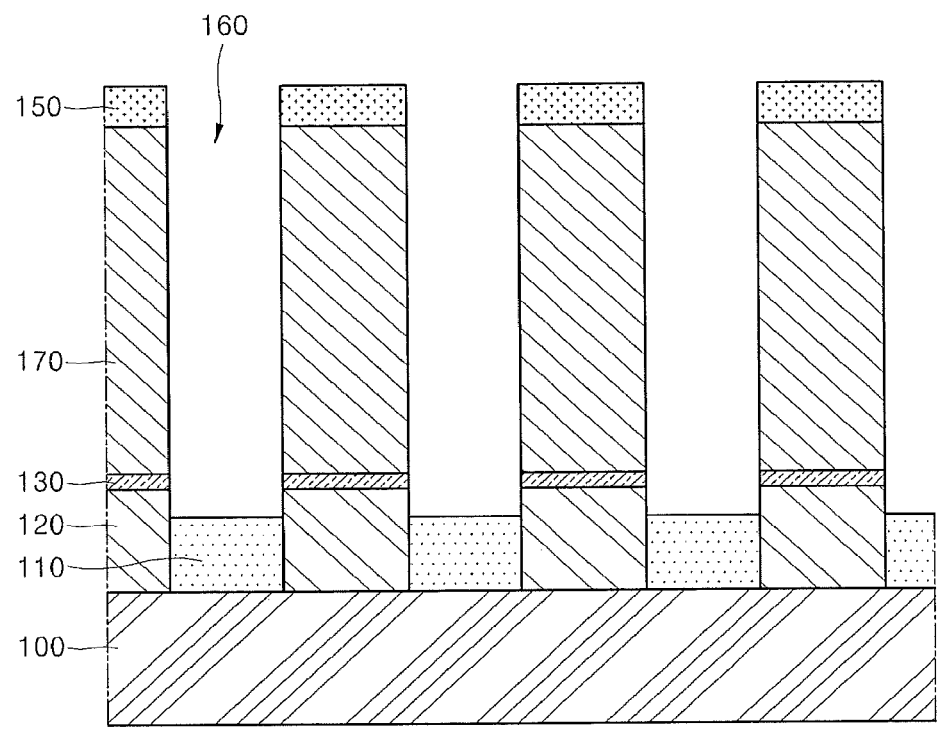
FIGS. 4A to 4G are cross-sectional views illustrating methods of fabricating semiconductor devices including capacitors according to some embodiments of the present invention.

Referring to FIG. 4A, contact lines 110 and inter-layer insulation films 120 may be formed on the semiconductor substrate 100 including a cell region, and a peripheral region (or core region) arranged outside of the cell region. An etch stop film 130 may be formed using silicon nitride (SiN) or the like on the contact lines 110 and inter-layer insulation films 120. The contact lines 110 may be, for example, storage node contact plugs which are electrically connected to conductive regions of the cell region of the semiconductor substrate 100 (such as source/drain regions of respective memory cell access transistors).

A mold oxide film 170 may be formed on a whole surface of the etch stop film 130 and a support pad film 150 may be formed on the mold oxide film 170. The mold oxide film 170 may be formed of a material such as $SiO_2$, SiGe, Si, and/or a carbonaceous material, and the support pad 150 may be formed of a material having an etching selectivity which is different from that of the mold oxide film 170. In addition, the support pad 150 may be formed of a dielectric material having a relatively low etch rate with respect to LAL when an LAL lift-off process is used to remove the mold oxide film. For example, the support pad 150 may be formed of any one of SiN, SiCN, TaO, and/or $TiO_2$ to a thickness in the range of 500 to 1,500 Å (Angstroms). However, the material used to form the support pad 150 and/or the thickness thereof are not limited thereto.

When the support pads 150 are formed, a plurality of holes 160 may be formed at positions of lower electrodes by dry etching the support pads film 150, the mold oxide film 170, and the etching stop film 130 until the contact lines 120 are exposed. The holes 160 may be formed so that the lower electrodes to be formed later can be arranged in a plurality of rows and/or columns. In addition, the holes 160 may be disposed to form a plurality of lines in diagonal directions. In some embodiments, the holes 160 may be formed to arrange the lower electrodes in a zigzag pattern to increase space.

The support pad film 150 may have a greater thickness than desired in consideration of an amount of the support pad film 150 that may be etched when the etch stop film 130 is etched.

Figure 4B:
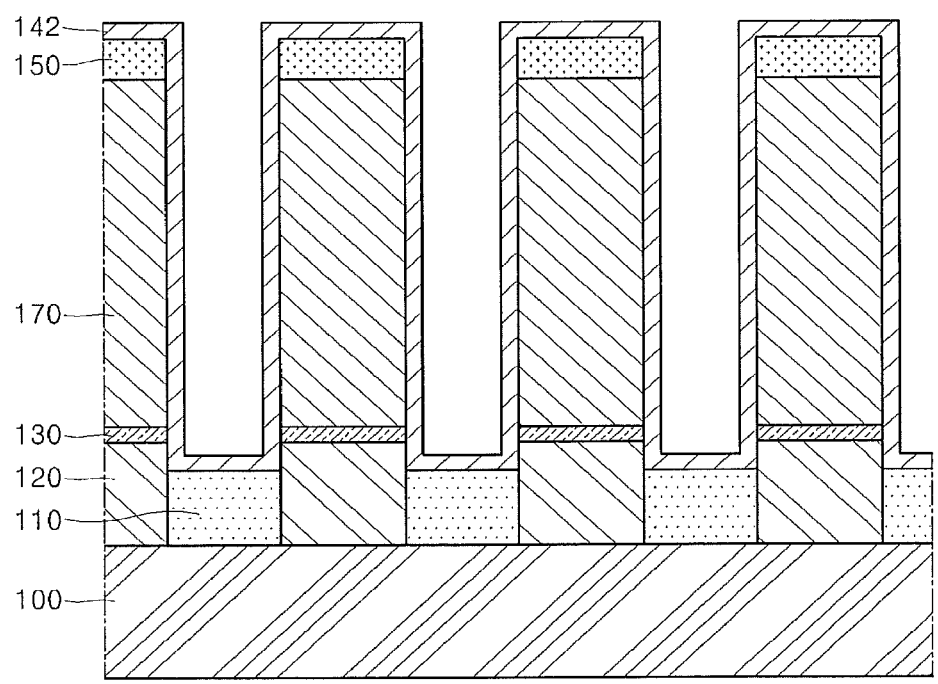
Figure 5A:
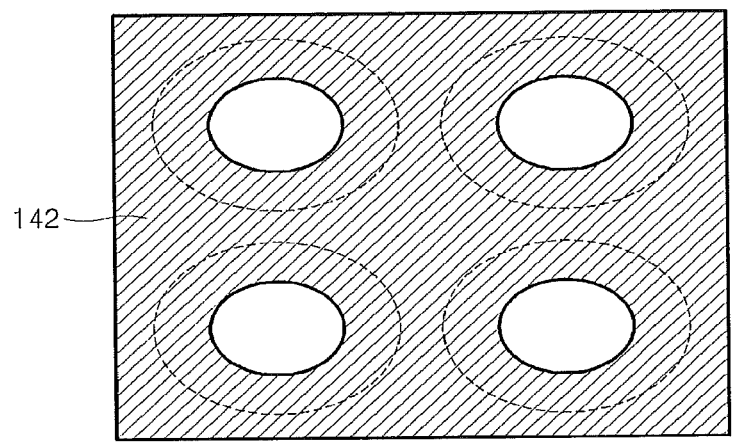
FIGS. 5A to 5D are plan views of the semiconductor device structures shown in FIGS. 4B, 4C, 4D and 4E respectively.

Referring to FIGS. 4B and 5A, a conductive material may be deposited on an entire surface of the semiconductor substrate 100, that is, on inner surfaces of holes and the support pads 150 to form lower electrode layer 142. A dotted line in FIG. 5A indicates holes before the lower electrode layer 142 is formed.

Figure 4C:
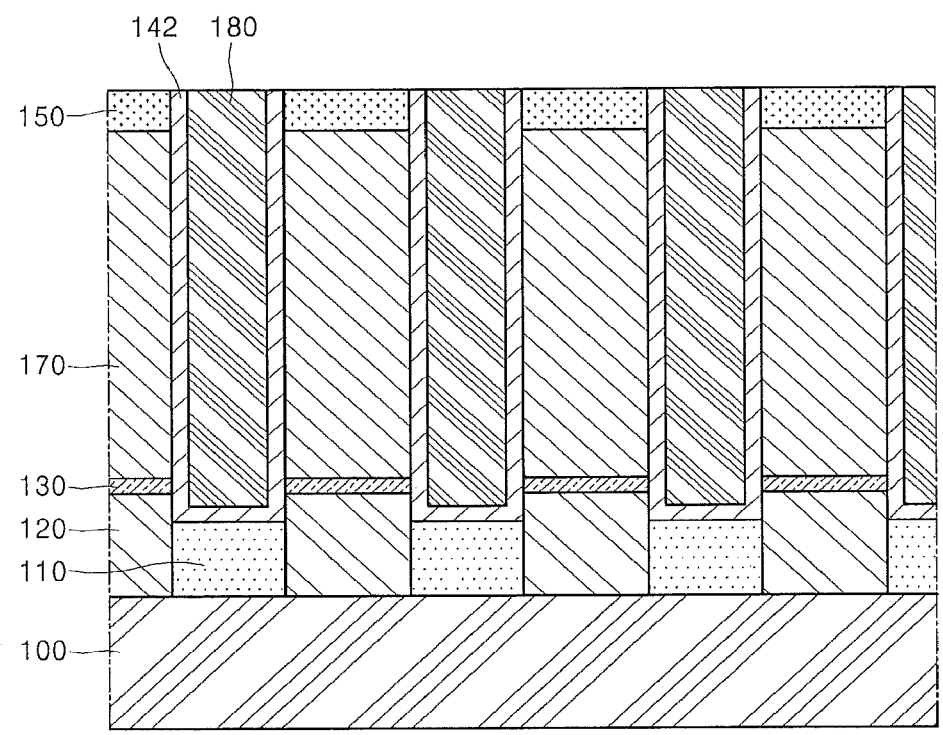
Figure 5B:
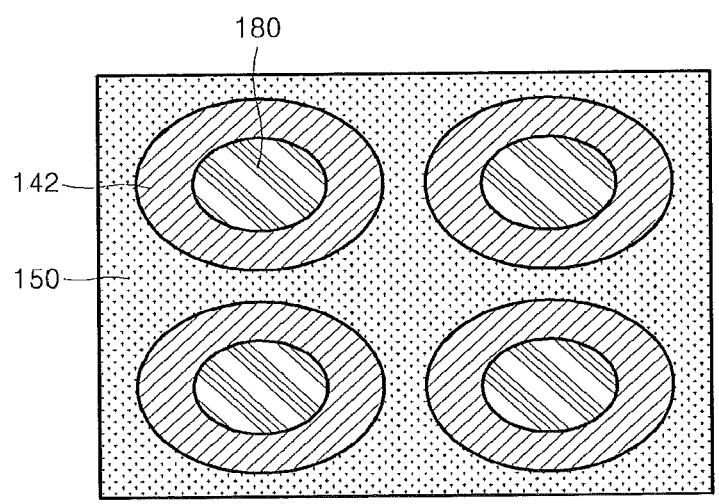

Referring to FIGS. 4C and 5B, after the lower electrodes 142 are formed, an oxide film 180 may be formed on the entire surface of the semiconductor substrate 100 so that the holes 140 on which the lower electrodes 142 are formed can be completely filled. When the oxide film 180 is formed, the oxide film 180 may be subject to planarization and removal until the support pad film 150 is exposed through a chemical mechanical planarization (CMP) process to separate the lower electrodes 142, that is, to provide node separation.

FIG. 5B is a plan view of a semiconductor device after a planarization process is performed using a CMP process. The oxide film 180 may be filled in cyclic lower electrodes 142, and portions of the oxide film 180 on the support pads 150 may be completely removed by the CMP process.

Figure 4D:
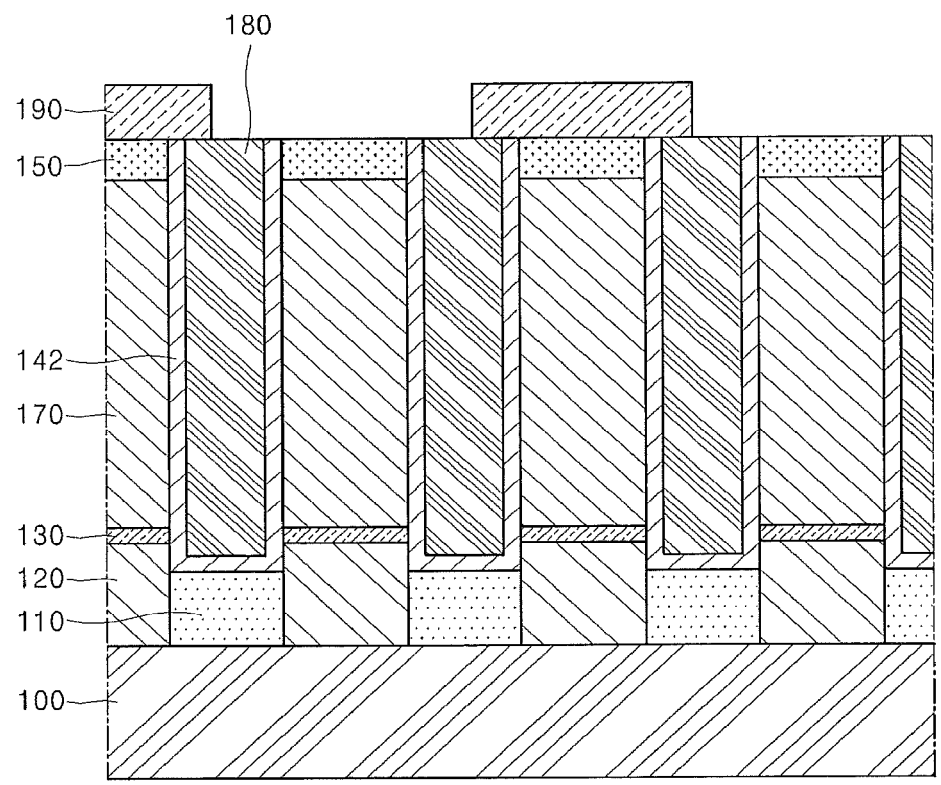
Figure 5C:
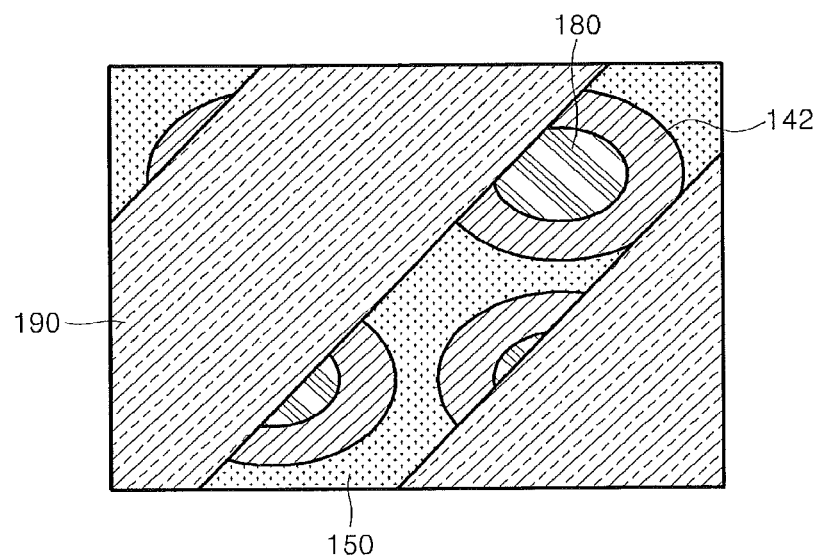

Referring to FIGS. 4D and 5C, after the planarization process is performed, a photo resist (PR) pattern 190 may be formed on the resulting structure of FIGS. 4C and 5B using an exposure process to pattern the support pad film 150. The PR pattern may be formed so that the support pad film 150 is patterned in stripes, for example, stripes connecting respective pairs of neighboring rows, columns, or diagonal lines of the lower electrodes 142.

FIG. 5C is a plan view of a semiconductor device structure after a PR pattern is formed in a diagonal direction. A size (e.g., width) of the PR pattern may be greater than a diameter of the lower electrodes 142.

In the formation of conventional lattice type support pads, a micro-sized PR pattern may be used to form support pads between all of the lower electrodes. Accordingly, the exposure process may be difficult to perform due to problems such as alignment. However, because the support pads 150 according to embodiments of the present invention are formed in stripes, a PR pattern having a relatively simple shape and a relatively large size can be formed, and thus the exposure process to form the PR pattern may be performed relatively easily.

Meanwhile, even though not shown, the PR pattern may extend to the cell block edge to extend the support pads 150 to the cell block edge in consideration of an amount of support pad material that may melt during subsequent wet etching of the mold oxide film 170. In addition, the PR pattern may be formed to connect two or more of the support pads at the cell block edge.

Figure 4E:
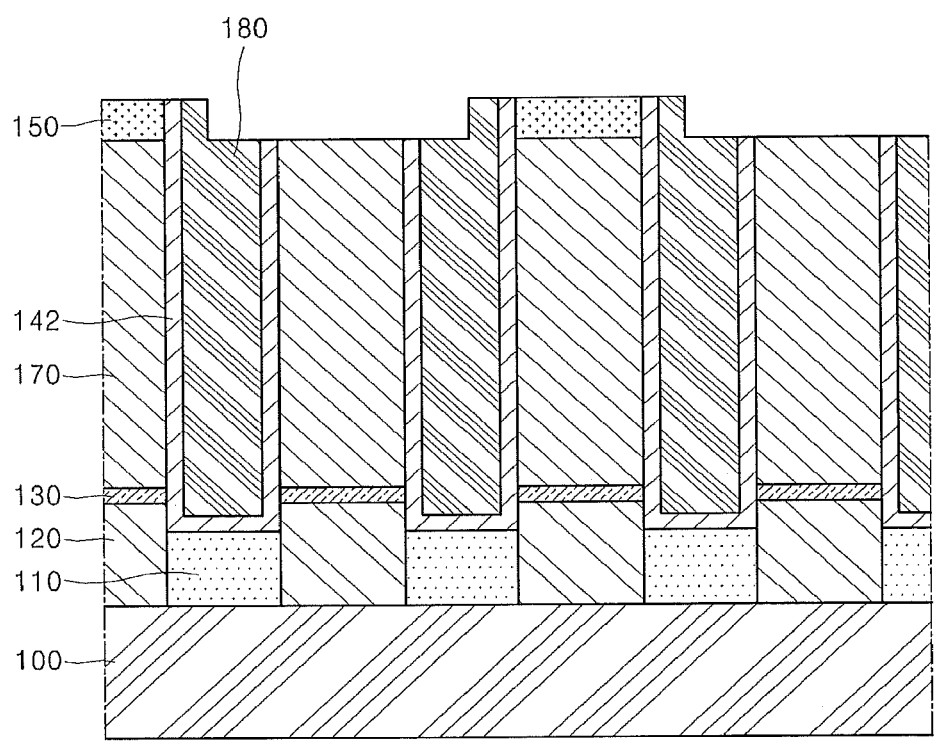
Figure 5D:
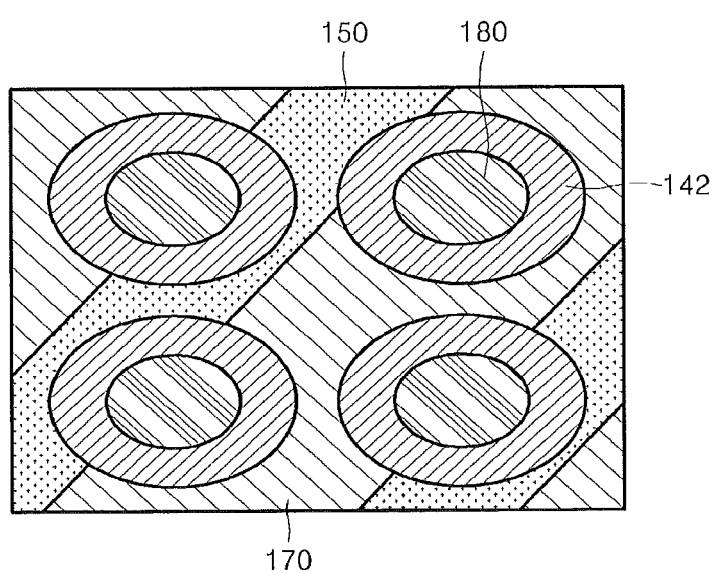

Referring to FIGS. 4E and 5D, support pads 150 formed in stripes aligned in various directions as described above may be formed by dry etching the support pad film using the formed PR pattern 190. The support pads 150 may be formed to extend to cell block edge as described above.

Heights of portions of the lower electrodes 142 on which the support pads 150 are not formed may be reduced because the support pad film 150 may be etched with the lower electrodes 142. However, the lower electrodes 142 may not be significantly etched by using an appropriate etching method, for example, using an etching gas having different etch rates with respect to the support pad film 150 and the lower electrodes 142 when the support pad film 150 is etched.

Referring to FIG. 5D, each of the support pads 150 may have a width smaller than that of the PR pattern shown in FIG. 4C and the support pads 150 may be formed stripes. The support pads 150 may be reduced by removing unnecessary portions to provide a space between the lower electrodes 142 for uniform and easy deposition of subsequent materials such as the dielectric films. Meanwhile, the support pads 150 having the reduced width may be prepared by forming the PR pattern to be fitted to the reduced width of the support pads 150, or by forming the PR pattern larger than the support pads 150 and then overetching.

Figure 4F:
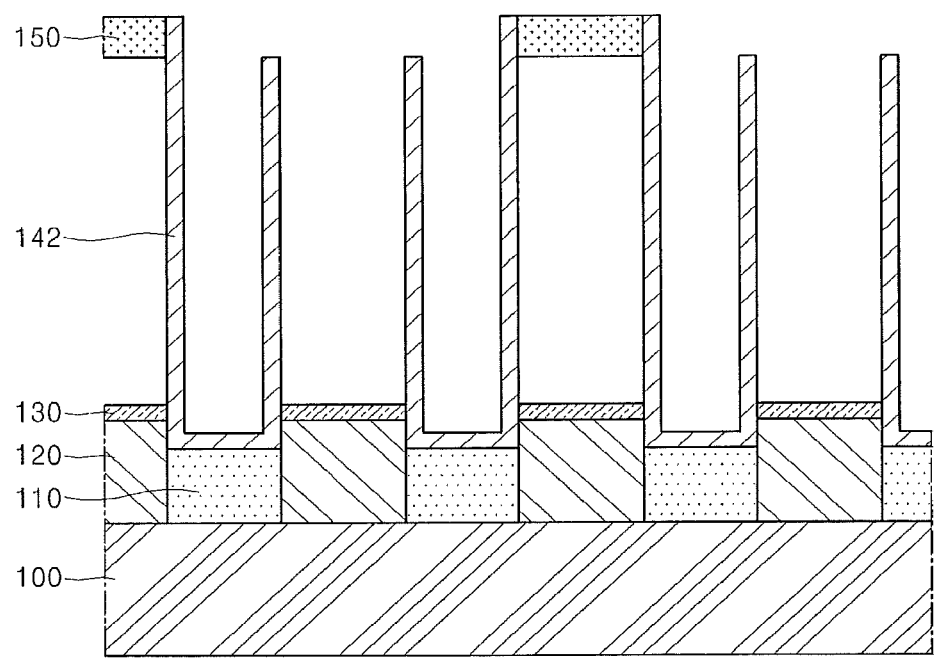

Referring to FIG. 4F, when the support pads 150 in the shape of stripes are formed, the mold oxide film 170 and the oxide film 180 may be removed using wet etching, for example, using an LAL lift-off process.

Figure 4G:
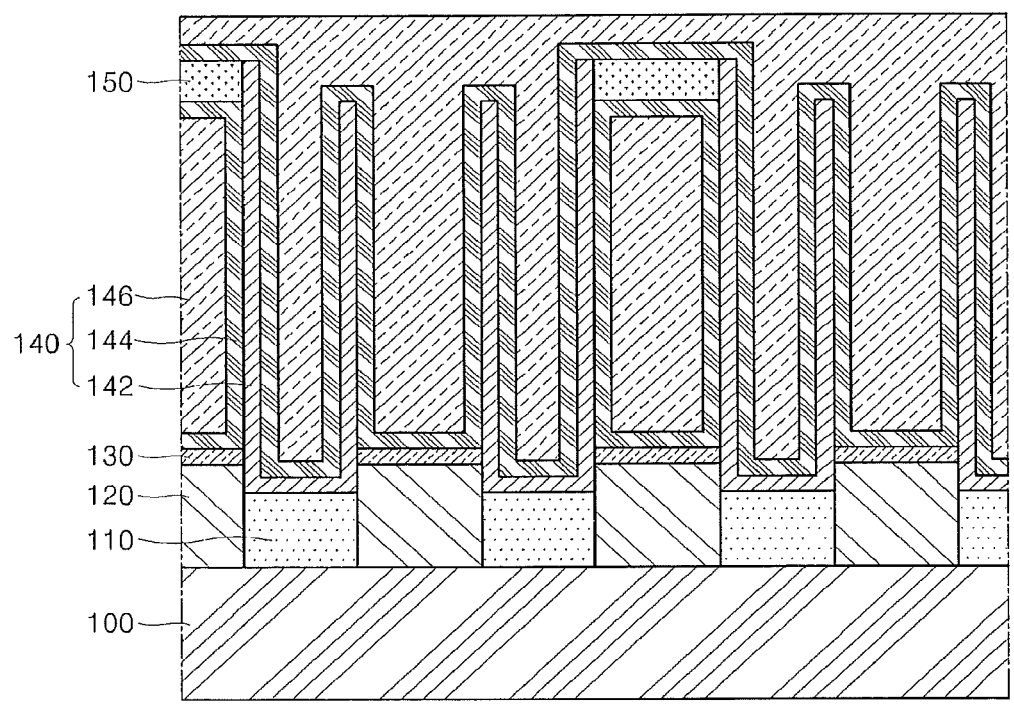

Referring to FIG. 4G, a dielectric material may be deposited on the entire surface of the resulting structure where the oxide film 180 is removed to form a dielectric film 144, and a conductive material may be deposited on the dielectric film 144 to form upper electrodes 146, and thus cylindrical capacitors 140 may be prepared.

In embodiments of FIGS. 4A-G and 5A-D, the dielectric film and the upper electrodes may be symmetrically and uniformly deposited after wet etching and removing the mold oxide film due to a sufficient space between the lower electrodes obtained by forming the support pads in stripes. Accordingly, deterioration in electric characteristics caused by non-uniform deposition of materials can be reduced.

Figure 6:
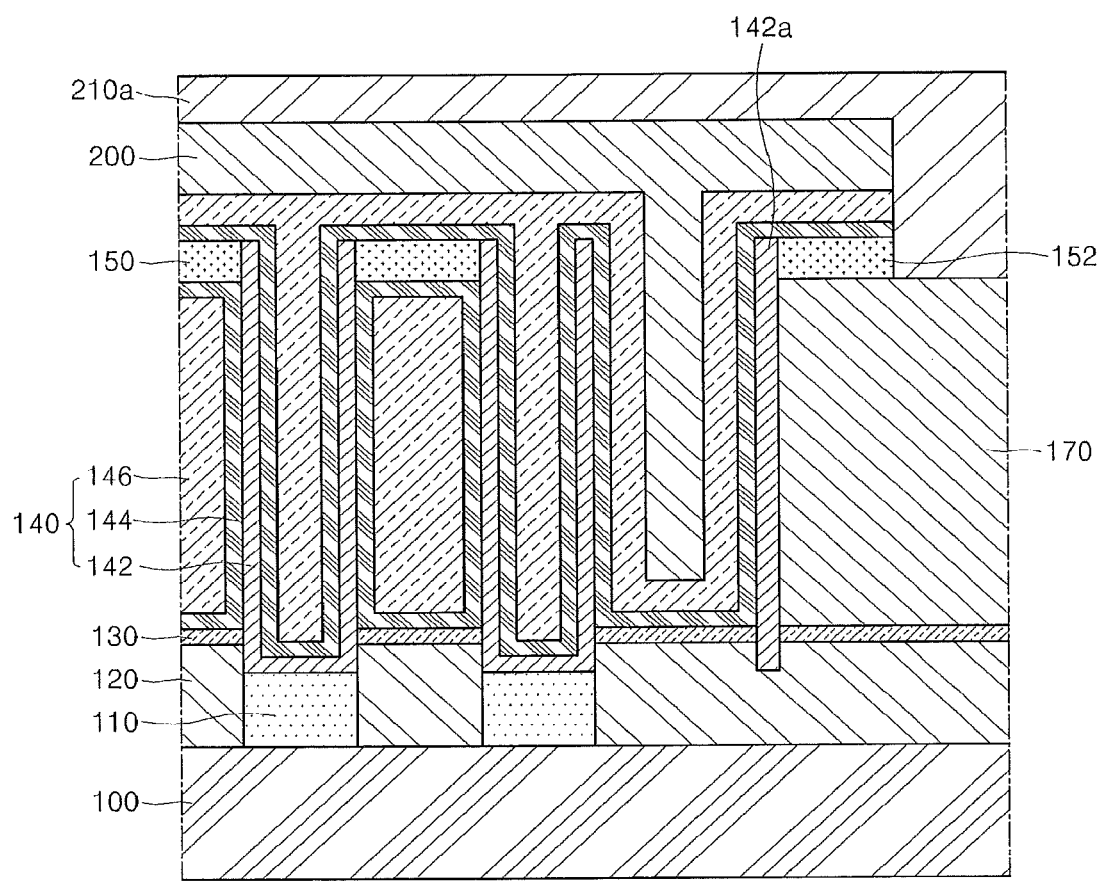
FIG. 6 is a cross-sectional view of a semiconductor device that may reduce an excess CMP using a guard ring and external support pads according to other embodiments of the present invention.

FIG. 6 is a cross-sectional view of a semiconductor device according to other embodiments of the present invention. In the semiconductor device of FIG. 6, the CMP process can be omitted or excess CMP can be reduced by reducing a level difference between the cell region and the peripheral region (or the core region) using a guard ring formed outside the cell region. Hereinafter, the configurations described with reference to FIG. 3 will be simply described and the newly added configurations will be described in more detail.

FIG. 6 illustrates a cell region and a peripheral region (or core region) of a semiconductor substrate which is not shown in FIG. 3. Referring to FIG. 6, the semiconductor device may include a plate electrode film 200 and planarization oxide film 210a formed at upper portions of the cylindrical capacitors. In the semiconductor device of FIG. 6, a mold oxide film 170 may be maintained in the peripheral region (or core region) using a guard ring 142a formed outside of the cell region and external support pads 152 formed outside the guard ring 142a to form the planarization oxide film 210a with a relatively thin thickness, and thus excess CMP can be reduced. Although the reference numeral 150 indicated the support pad film or the support pads with reference to FIG. 3, it will be referred to as capacitor support pads to be distinguished from the external support pads 152 hereinafter.

The external support pads 152 may be formed of the same material used to form the capacitor support pads 150 of the cell region and may be formed in the peripheral region (or the core region) of the semiconductor device. The mold oxide film 170 may be maintained under the external support pads 152. Because the mold oxide film 170 is maintained, the planarization oxide film 210a having a thickness less than 5,000 Å (Angstroms) may be deposited, and thus a relatively thin layer may be removed by the CMP, or the CMP process may be omitted. In addition, a guard ring 142a may be formed to separately maintain the external support pads 152 of the peripheral region (or core region) from the capacitor support pads 150 of the cell region.

Hereinafter, a method of fabricating a semiconductor device will be described in more detail with reference to FIGS. 7A to 7G.

FIGS. 7A to 7G are cross-sectional views illustrating a method of fabricating a semiconductor device of FIG. 6. Descriptions presented with reference to FIGS. 4A to 4G will be omitted or briefly described.

Figure 7A:
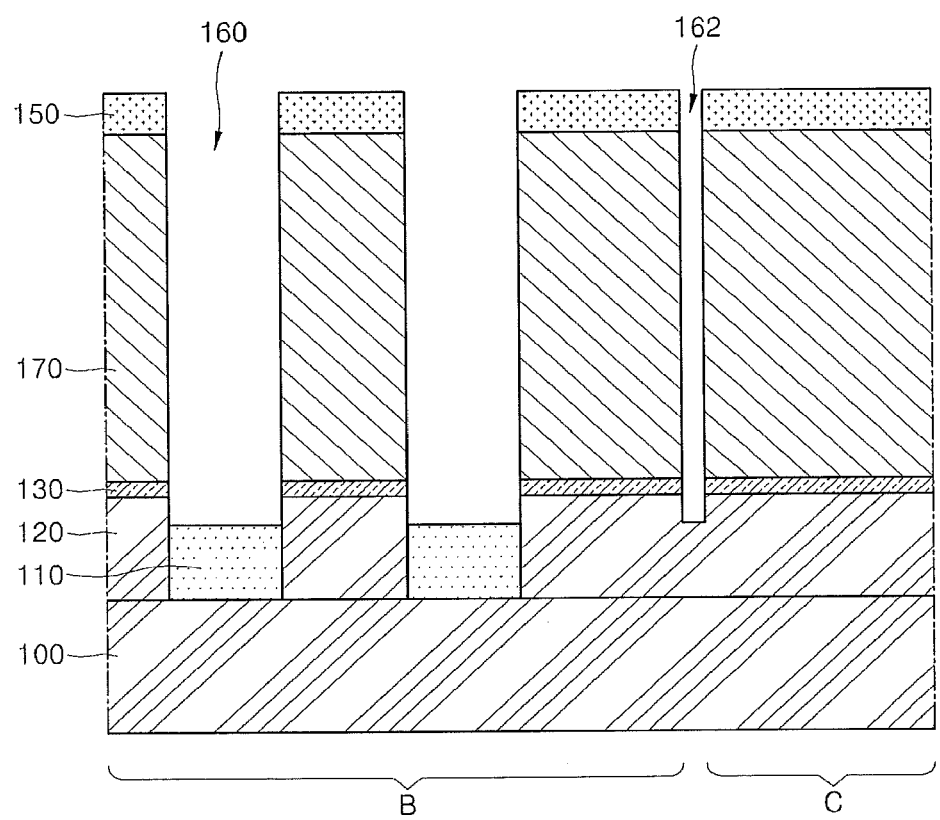
FIGS. 7A to 7G are cross-sectional views illustrating methods of fabricating a semiconductor device of FIG. 6.

Referring to FIG. 7A, contact lines 110 and inter-layer insulation films 120 may be formed on the semiconductor substrate 100 including a cell region B, and a peripheral region (or core region) C arranged outside of the cell region. An etch stop film 130 may be formed using silicon nitride (SiN) or the like on the contact lines 110 and inter-layer insulation films 120. The contact lines 110 may be, for example, storage node contact plugs, which are electrically connected to conductive regions of the cell region of the semiconductor substrate 100 (such as source/drain regions of memory cell access transistors).

A mold oxide film 170 may be formed on the entire surface of the etch stop film 130, and a support pad 150 may be formed on the mold oxide film 170. The mold oxide film 170 may be formed of a materials such as $SiO_2$, SiGe, Si, and/or a carbonaceous material, and the support pad 150 may be formed of a material having an etching selectivity which is different from that of the mold oxide film 170. For example, the support pad 150 may be formed of any one of SiN, SiCN, TaO, and $TiO_2$ to a thickness in the range of 500 to 1,500 Å (Angstroms). Meanwhile, the capacitor support pads 150 may have a greater thickness than desired in consideration of an amount of the support pad film 150 that is etched when the etching stop film 130 is etched.

After the capacitor support pads 150 are formed, a plurality of holes 160 may be formed at positions on which the lower electrodes will be formed later by dry etching the capacitor support pads 150, the mold oxide film 170, and the etch stop film 130 until the contact lines 120 are exposed. Meanwhile, holes 162 for the guard ring surrounding the cell region may be simultaneously formed when the holes 160 are formed. The holes 162 for the guard ring may be formed close to the cell region to improve integration of semiconductor devices, for example, within a distance of less than about 4,000 Å (Angstroms) from the outermost capacitors, and the width of holes 162 may be reduced.

The holes 160 of the cell region may be formed so that the lower electrodes to be formed later can be arranged to form a plurality of rows and columns. In addition, the holes 160 may also be disposed to form a plurality of lines in diagonal directions, or the holes 160 may be formed to arrange the lower electrodes in a zigzag pattern to increase space.

Figure 7B:
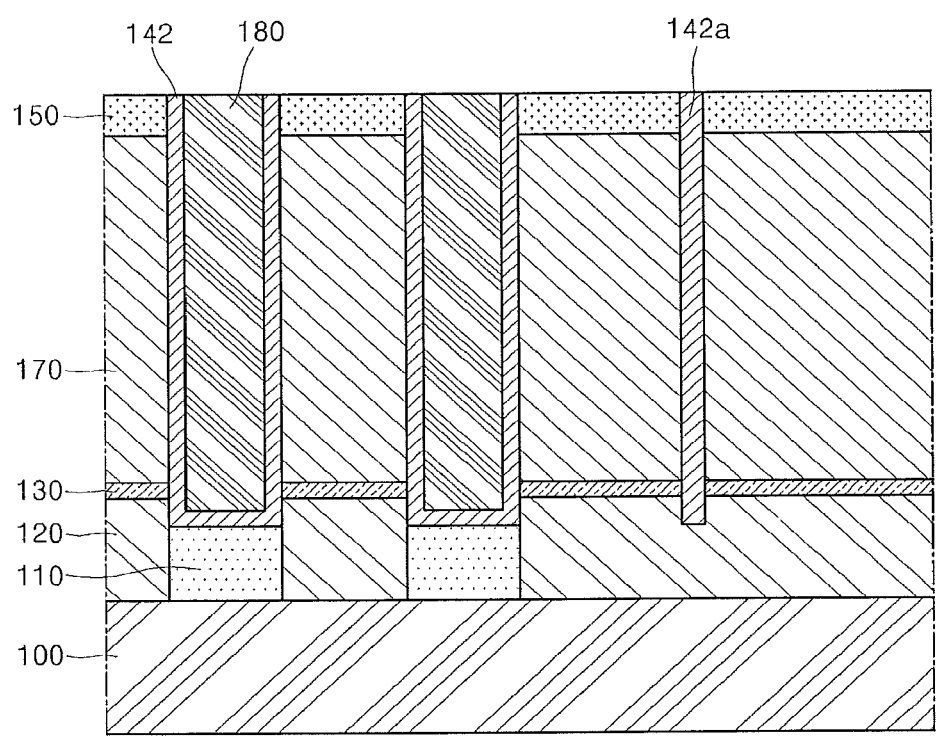

Referring to FIG. 7B, a conductive material may be deposited on an entire surface of the resulting structure, that is, on inner surfaces of the holes 160 and the capacitor support pads 150, and electrode separation may be performed to form the lower electrodes 142 and a guard ring 142a. The guard ring 142a may have a side cross-section of the lower electrodes 142, but also may have the same cross section of the lower electrodes 142 when the holes 162 for the guard ring 142a have a large diameter.

Figure 7C:
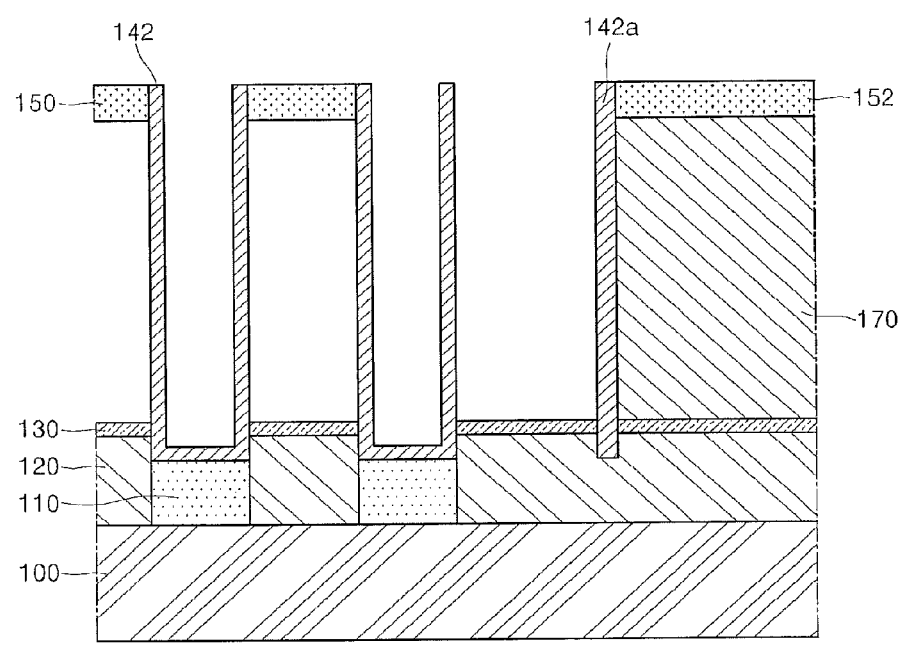

Referring to FIG. 7C, after nodes are separated, the support pad film 150 may be patterned using an exposure and etching process. Thus, the capacitor support pads 150 may be formed in stripes in the cell region and the external support pads 152 may be formed in the peripheral region or the core region. The external support pads 152 may be formed to cover the entire peripheral region (or core region) outside of the guard ring 142a. The capacitor support pads 150 may be formed in stripes arranged in various ways as described above, and may be formed to extend to the cell block edges. Two or more of the capacitor support pads 150 may be connected to each other at the cell block edges.

Once the capacitor support pads 150 and the external support pads 152 have been formed, the oxide film 180 and the mold oxide film 170 in the cell region may be completely removed by wet etching. Etching of the peripheral region (or core region), however, may be blocked by the guard ring 142a and the external support pads 152, and thus the mold oxide film 170 in the peripheral region (or core region) is not removed.

Figure 7D:
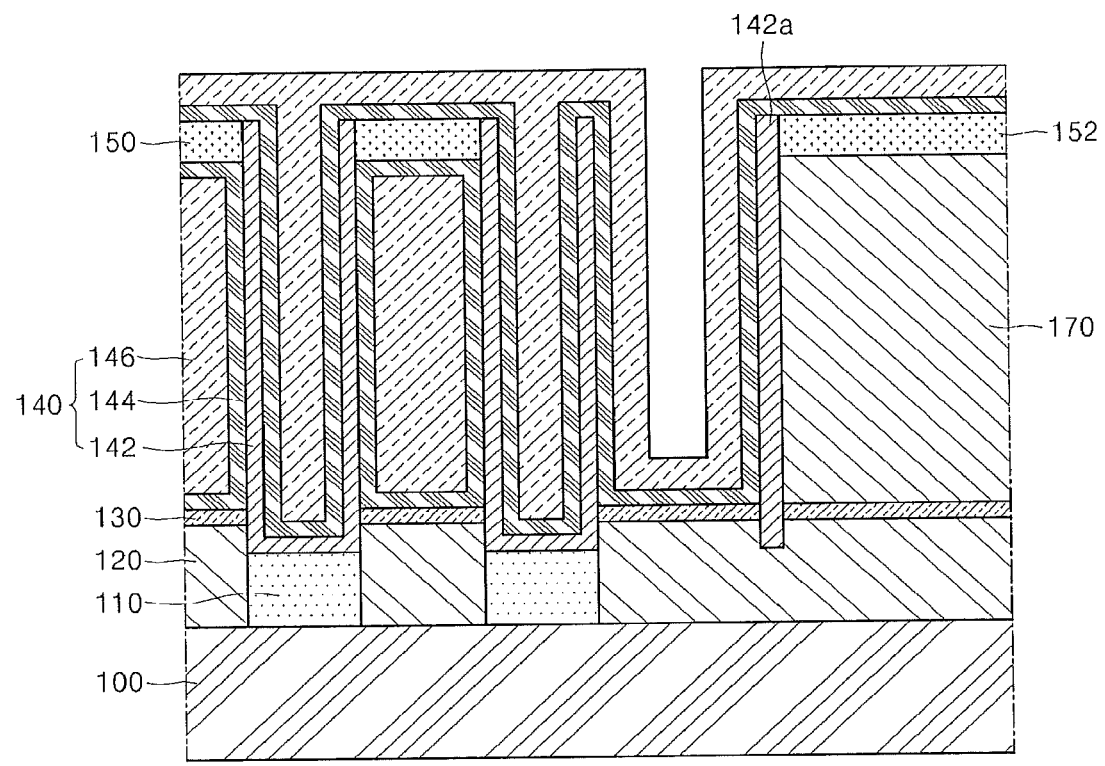

Referring to FIG. 7D, a dielectric film 144 and upper electrodes 146 may be deposited on the lower electrodes 142, on the capacitor support pads 150, and on the external support pads 152 to form capacitors (such as memory cell capacitors).

Figure 7E:
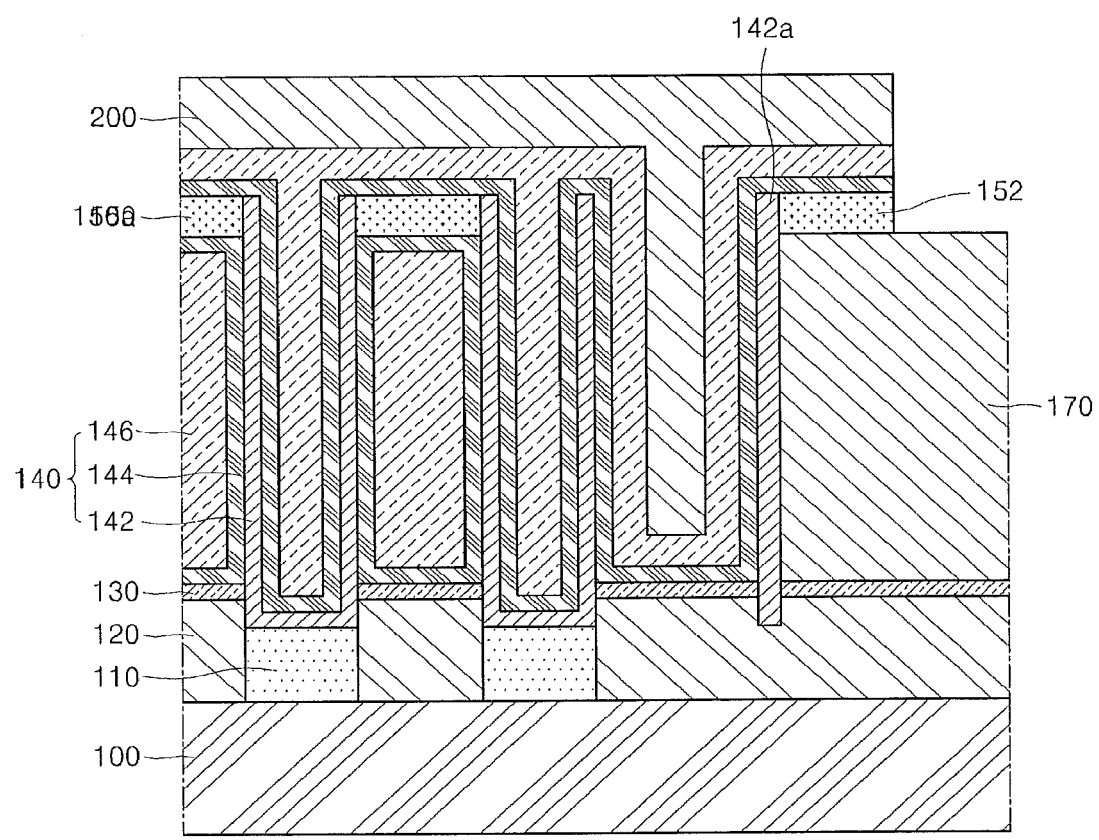

Referring to FIG. 7E, SiGe may be deposited on an entire surface of the resulting structure, and portions of the SiGe layer on the peripheral region (or core region) are etched to expose the mold oxide film 170 to form a plate electrode film 200 on the upper electrodes 146. That is, portions of the external support pads 152, the dielectric film 144, the upper electrode 146, and the plate electrode film 200 which are formed on the entire surface of the peripheral region (or core region) may be etched and removed, and only portions adjacent to the cell region may remain. The plate electrode film 200 may have a thickness of about 1,000 to 2,000 Å (Angstroms).

Figure 7F:
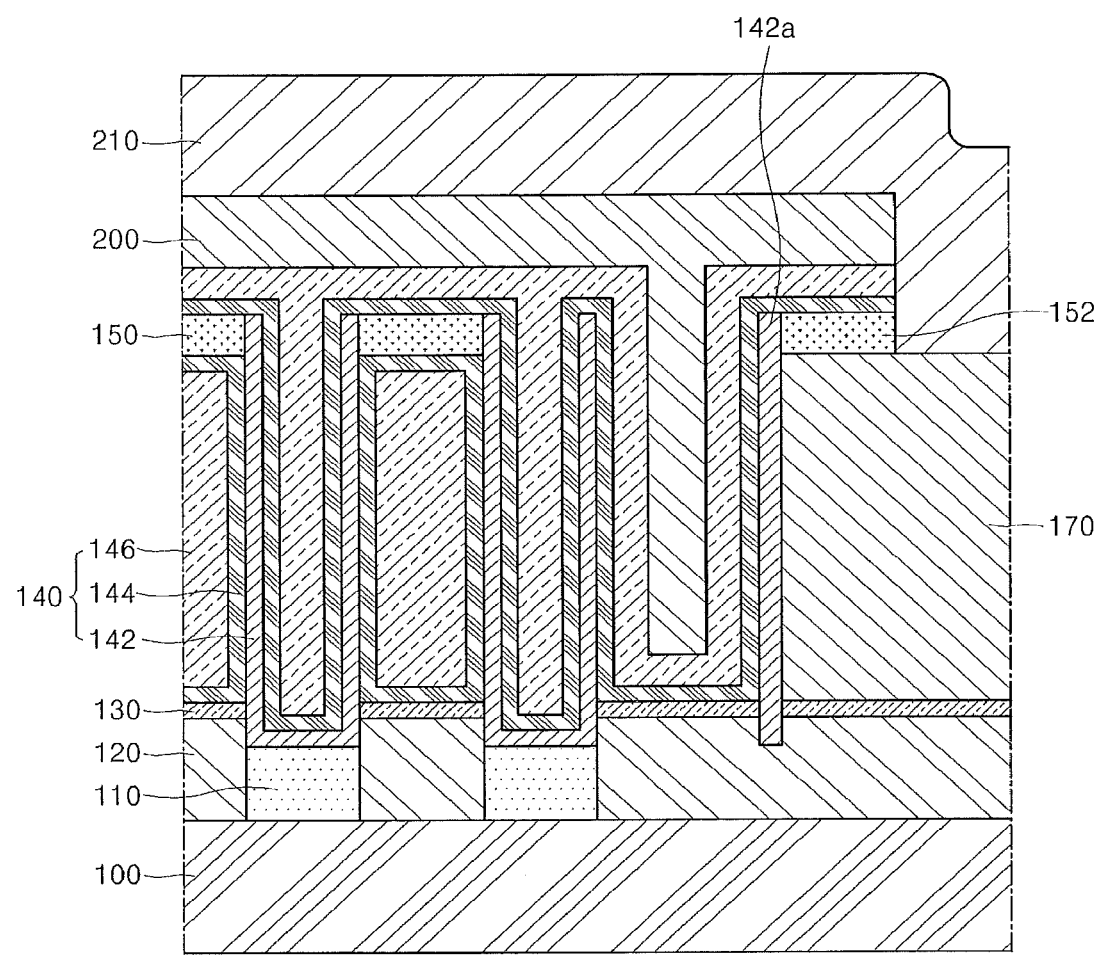

Referring to FIG. 7F, when the plate electrode film 200 is etched, a planarization oxide film 210 may be deposited on an entire surface of the resulting structure. The planarization oxide film 210 may be formed to insulate the plate electrode film 200 and reduce a level difference between the cell region and the peripheral region (or core region) using a CMP process. In the case of a conventional semiconductor device, because the mold oxide film 170 is not maintained on the peripheral region (or core region) of the conventional semiconductor device, the planarization oxide film 210 may be deposited to about 30,000 Å (Angstroms) or greater. However, since the mold oxide film 170 remains on the peripheral region (or core region) of the semiconductor device according to current embodiments of the present invention, a relatively thin planarization oxide film 210 may be formed. For example, a thickness of the planarization oxide film 210 may be less than 5,000 Å (Angstroms).

Figure 7G:
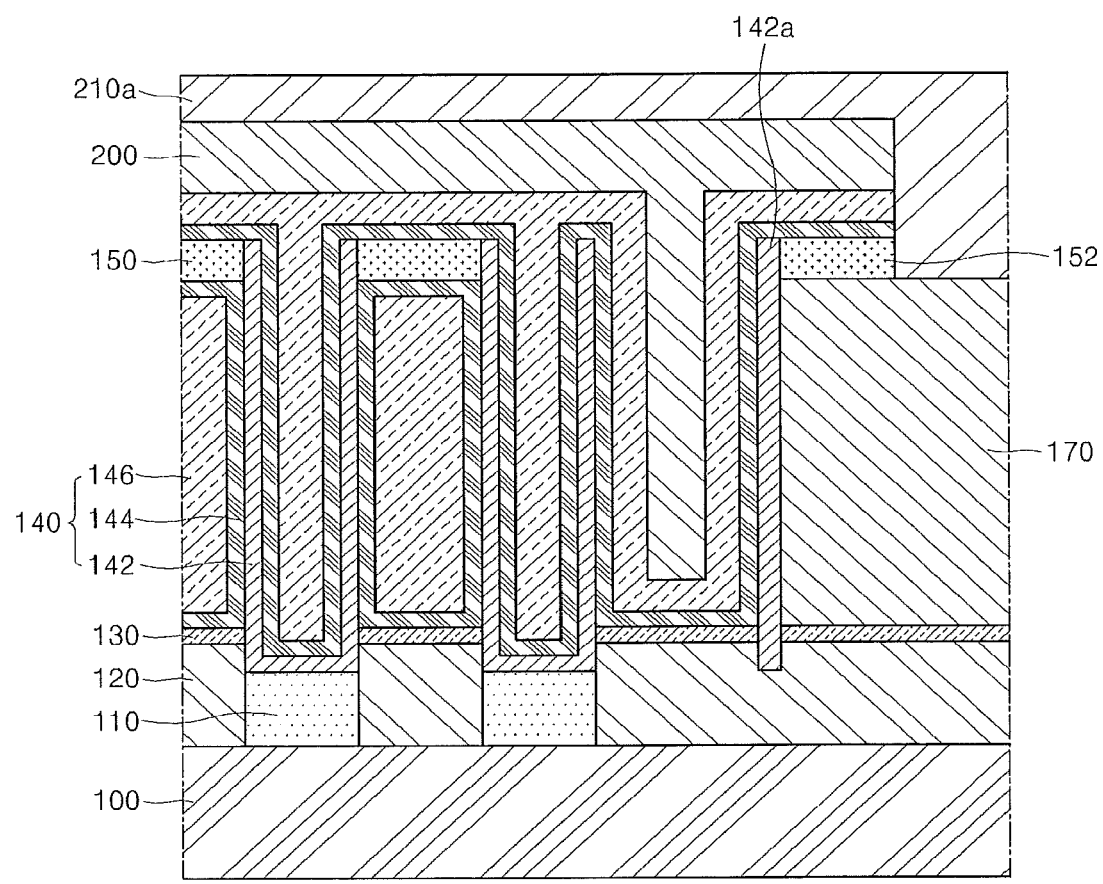

Referring to FIG. 7G, the planarization oxide film 210a may be planarized using a CMP process. Because the level difference between the cell region and the peripheral region (or core region) is not great, excess CMP can be reduced. When the level difference is minute, the CMP process can be omitted. Subsequent processes may be the same as in conventional semiconductor devices, and thus description thereof will not be presented.

A mold oxide film 170 can be maintained in the peripheral region (or core region) using a guard ring and external support pads in methods of fabricating a semiconductor device according to embodiments of FIGS. 7A to 7G. Accordingly, problems caused by excess deposition of the planarization oxide film and excess CMP for a metal plug process can be reduced.

Figure 8:
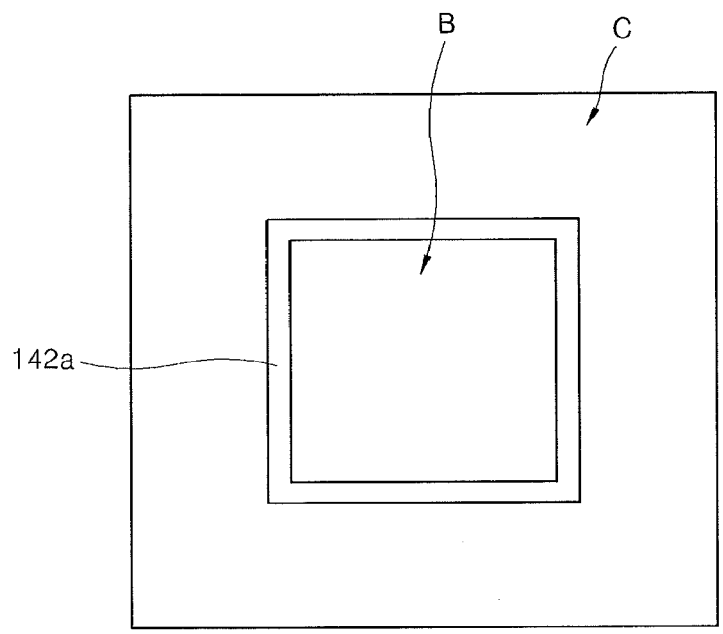
FIG. 8 is a horizontal cross-sectional view of a guard ring of FIG. 6.

FIG. 8 is a plan view of the guard ring 142a of FIG. 6, with the guard ring 142a having a square shape surrounding the cell region B. The guard ring 142a may be formed in consideration of shapes of the cell region and improvement of integration of the entire semiconductor device. The reference C may be used to designate the peripheral region (or core region) arranged outside of the cell region B.

Figure 9:
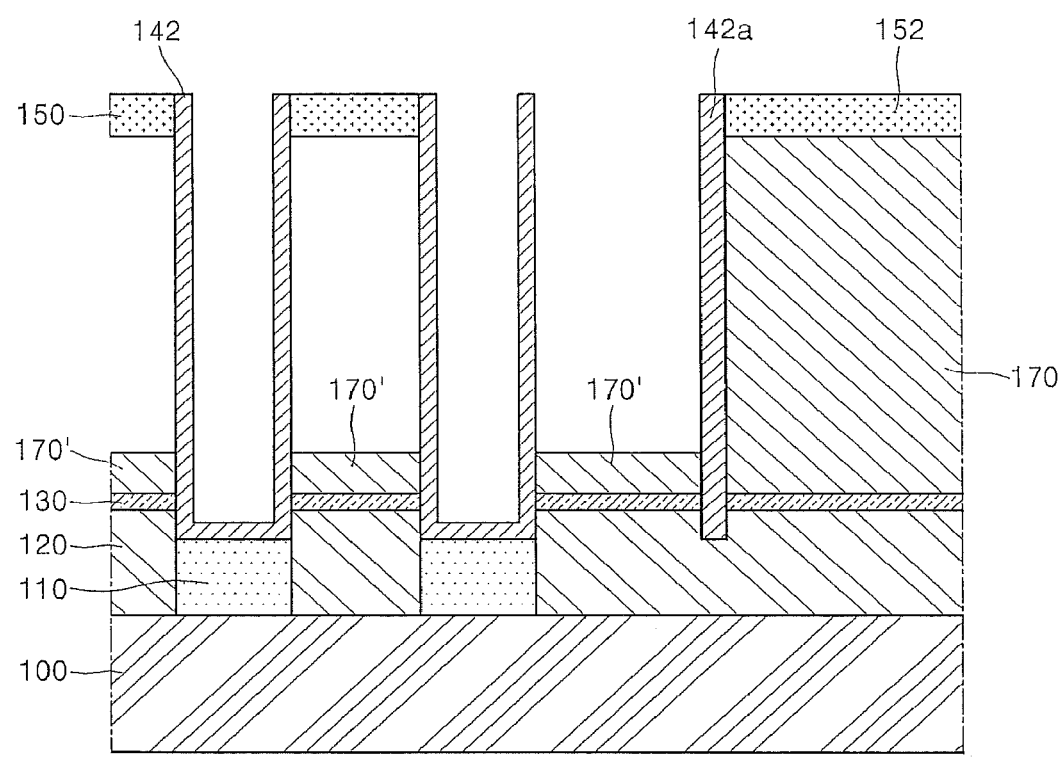
FIG. 9 is a cross-sectional view of a variation of the semiconductor device structure of FIG. 7C.

FIG. 9 is a cross-sectional view illustrating a variation of the semiconductor device structure of FIG. 7C. When the mold oxide film 170 of FIG. 7B is removed, a layer with a predetermined thickness, for example, 1,000 to 2,000 Å (Angstroms), of the mold oxide film 170' may remain between the lower electrodes 142. Thus, collapsing of the lower electrodes 142 may be further reduced by maintaining a portion of the mold oxide film 170' between the lower portions of the lower electrodes 142.

Figure 10:
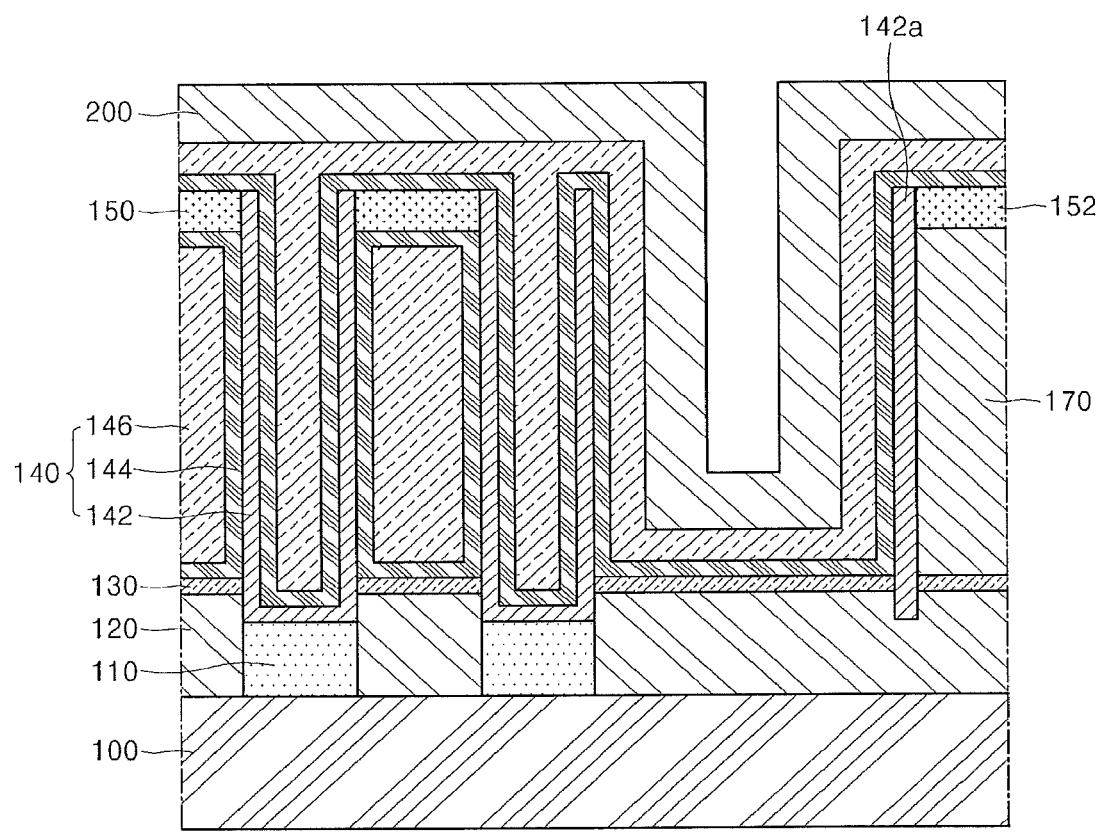
FIG. 10 is a cross-sectional view of a semiconductor device including a plate electrode film when a guard ring is formed according to some embodiments of the present invention.

FIG. 10 is a cross-sectional view of a semiconductor device structure including a plate electrode film when a guard ring is formed at a distance from a cell region. When the guard ring 142a is formed at a predetermined distance from the cell region, the plate electrode film 200 may not completely fill in the gap between the guard ring 142a and the nearest capacitor 140. Accordingly, the guard ring 142a may be formed within a predetermined distance from the outermost capacitors 140 of the cell region. For example, the guard ring 142a may be formed within a distance less than twice the thickness of the plate electrode film 200. More particularly, when the thickness of the plate electrode film 200 is in the range of 1,000 to 2,000 Å (Angstroms), the guard ring 142a may be formed within a distance less than 2,000 to 4,000 Å (Angstroms) from the outermost capacitors 140.

Figure 11A:
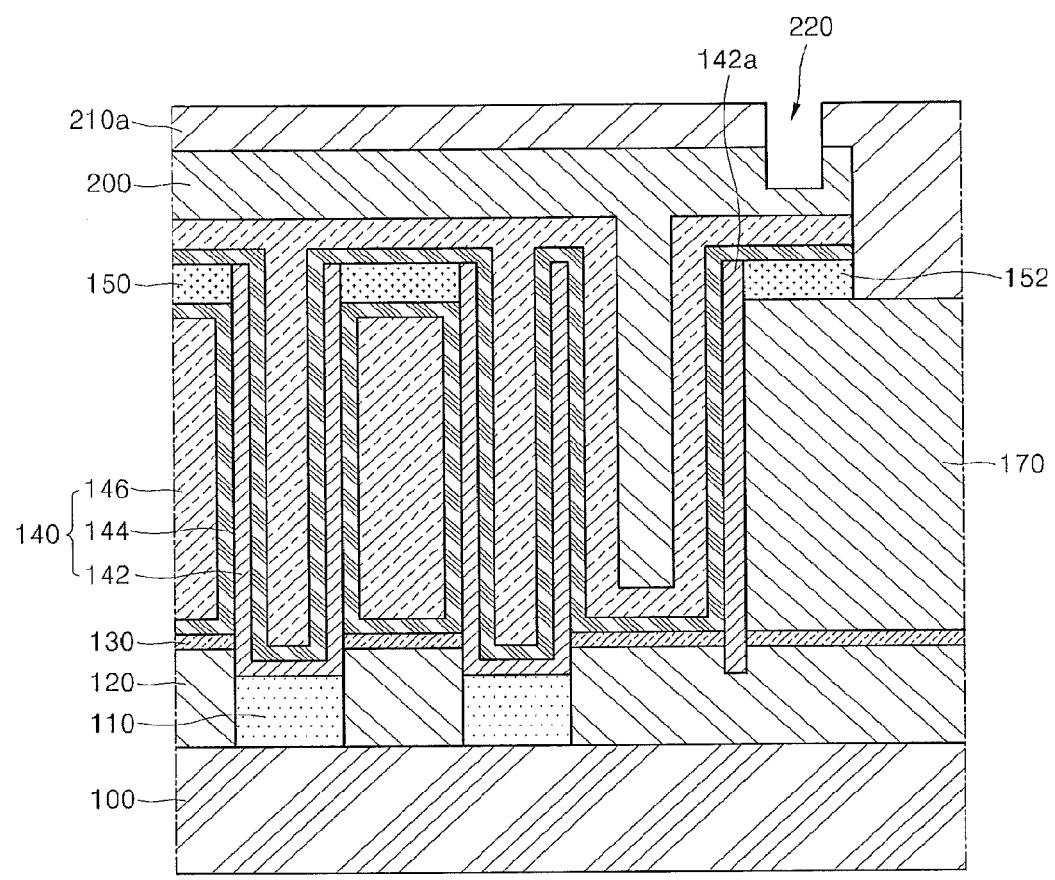
FIGS. 11A and 11B are cross-sectional views of semiconductor devices having contact holes used to form a metal plug according to some embodiments of the present invention.
Figure 11B:
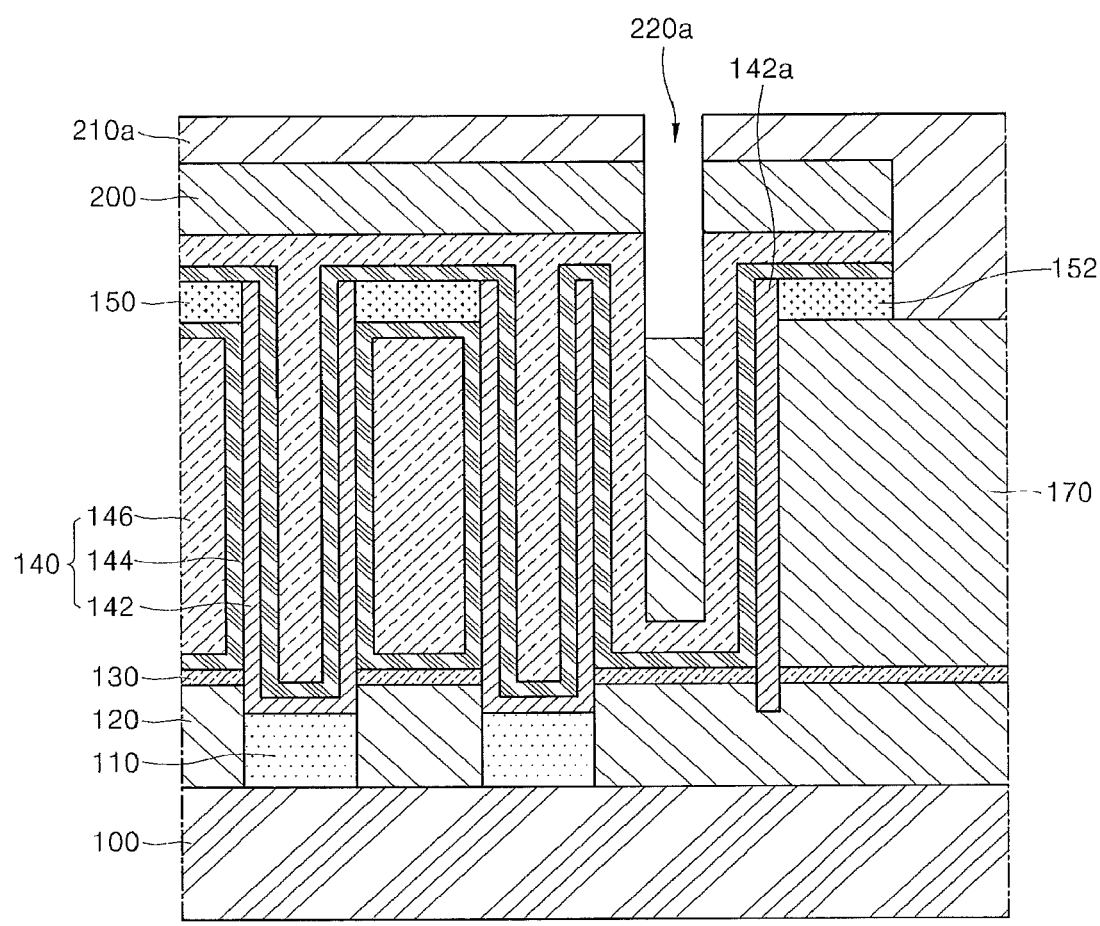

FIGS. 11A and 11B are cross-sectional views of semiconductor device structures in which a contact hole used to form a metal plug is formed.

FIG. 11A shows a semiconductor device structure in which shallow contact holes 220 are formed, and FIG. 11B shows a semiconductor device structure in which deep contact holes 220 are formed. The shallow contact holes 220 may provide an advantage that they can be formed at any portion of the entire surface of the plate electrode film 200, but the metal plug may have relatively high resistance due to a narrow contact area between the metal plug and the plate electrode film 200. On the other hand, the deep contact holes 220a may provide an advantage that the metal plug has relatively low resistance due to a wide contact area between the metal plug and the plate electrode film 200, but they may need to be formed precisely between the outermost capacitor 140 of the cell region and the guard ring 142a. However, the deep contact holes 220a shown in FIG. 11B are preferable due to the development of the current alignment technologies.

Figure 12:
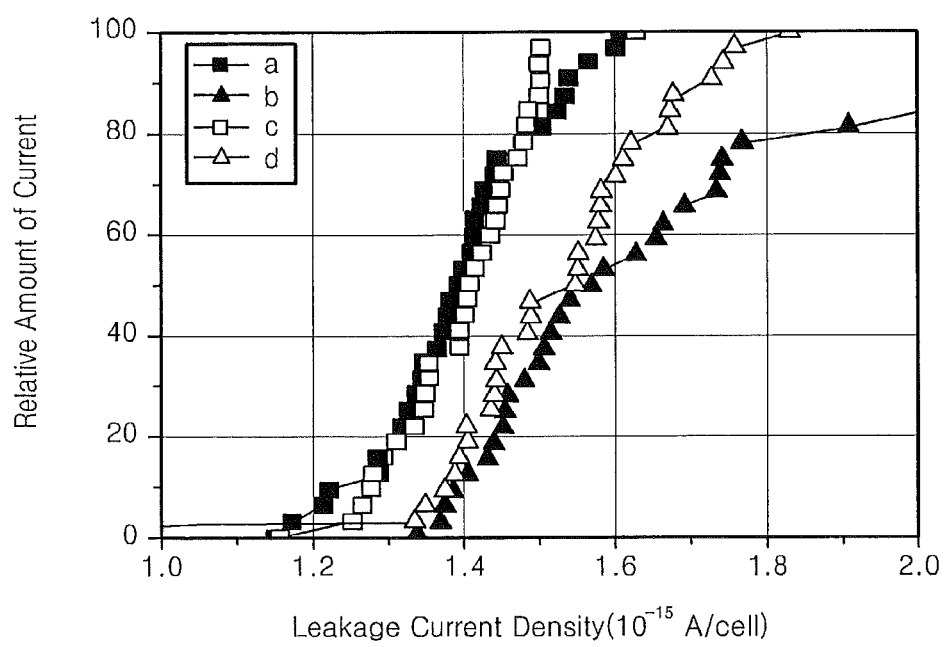
FIGS. 12 and 13 are graphs illustrating electrical characteristics of cylindrical capacitors including support pads formed in stripes according to some embodiments of the present invention.
Figure 13:
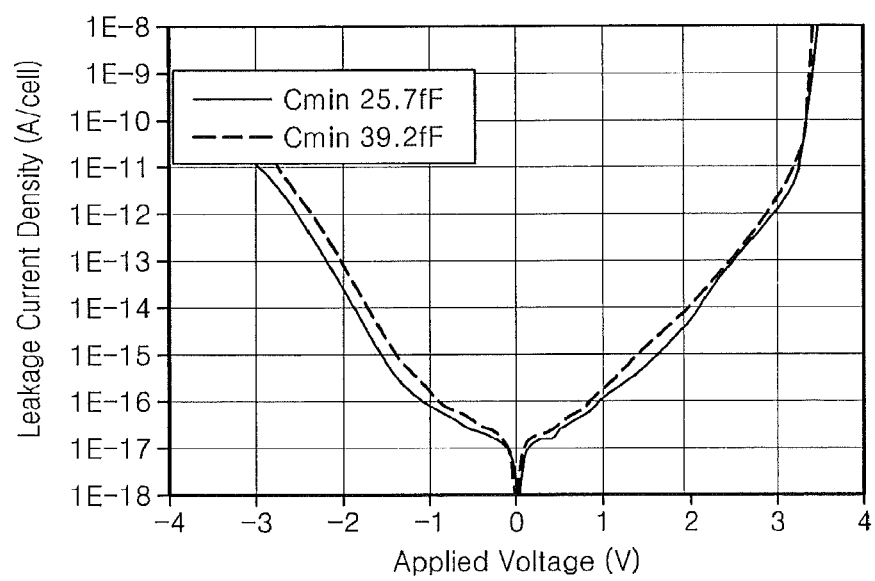

FIGS. 12 and 13 are graphs illustrating electrical characteristics of cylindrical capacitors including support pads formed in stripes.

FIG. 12 is a graph illustrating leakage current characteristics according to the alignment of the support pads formed in stripes as shown in FIGS. 2A to 2D. The x axis indicates the leakage current density, and the y axis indicates the relative amount of current. The black squares show leakage current characteristics of support pads arrayed as shown in FIG. 2A, the black triangles show leakage current characteristics of support pads arrayed as shown in FIG. 2B, the white squares show leakage current characteristics of support pads arrayed as shown in FIG. 2C, and the white triangles show leakage current characteristics of support pads arrayed as shown in FIG. 2D.

As shown in the graph, the semiconductor devices of FIGS. 2A and 2C in which adjacent support pads are not connected to each other at the cell block edge may provide better electrical characteristics compared to semiconductor devices of FIGS. 2B and 2D in which adjacent support pads are connected to each other at the cell block edge.

FIG. 13 is a graph illustrating leakage current density according to an applied voltage. The solid line shows electrical characteristics of a semiconductor device including a support pad pattern according to embodiments of the present invention, and the dotted line shows electrical characteristics of a conventional semiconductor device without a support pad pattern.

Capacitors of semiconductor devices including support pads according to embodiments of the present invention may provide an increase in capacitance of 50% or more as compared to conventional semiconductor devices. That is, a height of cylindrical lower electrodes according to embodiments of the present invention may be increased by almost two times compared to that of conventional lower electrodes.

As shown in the graph, although a capacitance provided by a semiconductor device including capacitors with support pads according to embodiments of the present invention may be increased by 50% or more, a leakage current density of the semiconductor device may be similar to that of a conventional semiconductor device.

In a semiconductor device including capacitors according to embodiments of the present invention, stress caused by the support pads and applied to the lower electrodes can be reduced by forming the support pads in stripes between the lower electrodes. In addition, subsequent materials such as materials for the dielectric film can be symmetrically and uniformly formed by providing a sufficient space between the lower electrodes. Accordingly, collapsing of lower electrodes may be reduced, and semiconductor devices including capacitors having improved electrical characteristics may be provided.

The mold oxide film of the peripheral region (or core region) can be maintained by forming a guard ring and external support pads outside the cell region, and quality issues resulting from excess deposition of an oxide film and/or an excess CMP process performed to reduce a level difference between the cell region and the peripheral region (or core region) before the formation of conventional metal plugs may be reduced.

As described above, in a semiconductor device including capacitors according to embodiments of the present invention, stress of the support pads applied to the lower electrodes may be reduced by forming support pads supporting the lower electrodes in stripes between the lower electrodes, with each support pad connecting a pair of neighboring rows, columns, or diagonal lines of the lower electrodes.

In addition, a relative pitch of the lower electrodes (that is a space between the lower electrodes) can be increased by forming the support pads in stripes, and more particularly by forming support pads in stripes that are symmetrical in a diagonal direction. Accordingly, an exposure process may be performed relatively easily because a larger sized PR pattern can be formed during the exposure process used to form patterns of the support pads. Thus, due to an enlarged space between the lower electrodes, subsequent materials (such as a material for the dielectric film) may be symmetrically and uniformly deposited.

Furthermore, the mold oxide film of the peripheral region (or core region) may be maintained by forming a guard ring and external support pads outside the cell region, and thus quality issues caused by excess deposition of the oxide film and/or an excess CMP process performed to reduce a level difference between the cell region and the peripheral region (or core region) before the formation of conventional metal plugs may be reduced.

As a result, according to embodiments of the present invention, a semiconductor device may be provided with improved stability and/or electrical characteristics, collapsing of lower electrodes may be reduced, subsequent materials may be symmetrically and uniformly deposited, and/or an excess CMP operation may be reduced/eliminated, by using support pads formed in stripes, a guard ring, and/or the external support pads.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor device, comprising:
a semiconductor substrate;
a first capacitor on the semiconductor substrate, the first capacitor comprising a first tubular lower electrode extending away from the semiconductor substrate in a vertical direction, the first tubular lower electrode having an upper end that is open, a first capacitor dielectric on the first tubular lower electrode and a first upper electrode on the first capacitor dielectric;
a second capacitor on the semiconductor substrate, the second capacitor comprising a second tubular lower electrode extending away from the semiconductor substrate in a vertical direction, the second tubular lower electrode having an upper end that is open, a second capacitor dielectric on the second tubular lower electrode and a second upper electrode on the second capacitor dielectric;
a first support structure comprised of an insulating material connecting an upper portion of the first tubular lower electrode with an upper portion of the second tubular lower electrode, the first support structure contacting a first side of the first tubular lower electrode and a first side of the second tubular lower electrode;
an insulation layer formed over the semiconductor substrate;
an etch stop layer formed over the insulation layer;
a first contact forming a physical and electrical contact to a bottom of the first tubular lower electrode, the first contact formed within a first opening in the insulation layer and the etch stop layer; and
a second contact forming a physical and electrical contact to a bottom of the second tubular lower electrode, the second contact formed within a second opening in the insulation layer and the etch stop layer,
wherein a portion of opposite substantially vertical sidewalls of the first tubular lower electrode are located within the first opening and adjacent to respective substantially vertical sidewalls of the insulation layer defining the first opening, and a portion of opposite substantially vertical sidewalls of the second tubular lower electrode are located within the second opening and adjacent to respective substantially vertical sidewalls of the insulation layer defining the second opening.

2. The semiconductor device of claim 1, wherein the first and second upper electrodes are part of a common upper electrode.

3. The semiconductor device of claim 2, wherein the common upper electrode comprises a conductive material located within the first and second tubular lower electrodes and within a gap between the first and second tubular lower electrodes.

4. The semiconductor device of claim 3, wherein a bottom of the common upper electrode located within the first tubular lower electrode is separated from the semiconductor substrate by a first distance, and a bottom of the common upper electrode located within the gap between the first and second tubular lower electrodes is separated from the semiconductor substrate by a second distance, the second distance being greater than the first distance.

5. The semiconductor device of claim 4, wherein the gap between the first and second tubular lower electrodes has a location under the support structure and the bottom of the common upper electrode located within the gap from which the second distance is measured has a location under the support structure.

6. The semiconductor device of claim 5, further comprising:
a third capacitor on the semiconductor substrate, the third capacitor comprising a third tubular lower electrode extending away from the semiconductor substrate in a vertical direction, the third tubular lower electrode having an upper end that is open, a third capacitor dielectric on the third tubular lower electrode and a third upper electrode on the third capacitor dielectric; and
a second support structure comprised of an insulating material contacting a first side of the third tubular lower electrode,
wherein the third tubular lower electrode comprises a second side, opposite the first side of the third tubular lower electrode, that is lower in height with respect to the semiconductor substrate than the first side of the third tubular lower electrode.

7. The semiconductor device of claim 6, wherein the third capacitor is adjacent the first capacitor, and the height of the second sides of the first tubular lower electrode and the third tubular lower electrode are substantially the equal.

8. The semiconductor device of claim 7, wherein the first support structure and the second support structure are separated patterns of an insulating material layer.

9. The semiconductor device of claim 7, wherein the third tubular lower electrode does not contact the first support structure and the first tubular lower electrode does not contact the second support structure.

10. The semiconductor device of claim 7,
wherein the common upper electrode comprises a conductive material located within a gap between the first tubular lower electrode and the third tubular lower electrode,
wherein a bottom of the common upper electrode located within the gap between the first tubular lower electrode and the third tubular lower electrode is separated from the semiconductor substrate by a third distance, the third distance being greater than the first distance.

11. The semiconductor device of claim 10, wherein the second and third distances are substantially equal.

12. The semiconductor device of claim 11, wherein the first, second and third tubular lower electrodes have circular cross sections.

13. The semiconductor device of claim 1,
wherein a top surface of the first contact is lower than the etch stop layer.

14. The semiconductor device of claim 13, wherein the first lower tubular electrode comprises a bottom end connecting the first side and second side of the first lower tubular electrode, wherein a top surface of the bottom end is lower than the etch stop layer.

15. The semiconductor device of claim 13, wherein the first and second contacts are first and second contact lines, respectively.

16. The semiconductor device of claim 13,
further comprising first and second memory cell access transistors,
wherein the first and second contacts are respectively connected to the first and second memory cell access transistors.

17. The semiconductor device of claim 1, wherein the first support structure contacts the uppermost ends of the first and second lower tubular electrodes.

18. The semiconductor device of claim 1, further comprising a plurality of capacitors including lower tubular electrodes, including the first and second capacitors including their respective first and second lower tubular electrodes, the plurality of capacitors being arranged, with respect to a top down view, in a plurality of rows extending in a first direction, capacitors of a row being staggered with respect to capacitors of immediately neighboring rows.

19. The semiconductor device of claim 18, wherein the first support structure is integral and extends in the first direction and contacts lower tubular electrodes of capacitors of a first row and a second row, the second row being an immediate neighbor of the first row.

20. The semiconductor device of claim 18,
wherein the first support structure is integral and extends in a direction at an acute angle with respect to the first direction,
wherein the plurality of capacitors are regularly distributed across a first area over the semiconductor substrate, the first area including a first border extending in the first direction and a second border extending in a second direction, the second direction being perpendicular to the first direction,
wherein the first border and the second border are borders for an array of capacitors, including the plurality of capacitors, such that capacitors are not located adjacent the first border and the second border outside the first area.

21. The semiconductor device of claim 20, wherein the first support structure contacts lower tubular electrodes of capacitors of at least three rows.

22. A semiconductor device, comprising:
a semiconductor substrate;
an insulation layer formed over the semiconductor substrate;
an etch stop layer formed over the insulation layer;
a first contact formed within a first opening in the insulation layer and the etch stop layer;
a second contact formed within a second opening in the insulation layer and the etch stop layer,
a first capacitor on the semiconductor substrate, the first capacitor comprising a first tubular lower electrode extending away from the semiconductor substrate in a vertical direction, the first tubular lower electrode having an upper end and a lower end, the lower end having a top surface and a bottom surface, the bottom surface of the lower end contacting the first contact, a first capacitor dielectric on the first tubular lower electrode and a first upper electrode on the first capacitor dielectric;
a second capacitor on the semiconductor substrate, the second capacitor comprising a second tubular lower electrode extending away from the semiconductor substrate in a vertical direction, the second tubular lower electrode having an upper end and a lower end contacting the second contact, a second capacitor dielectric on the second tubular lower electrode and a second upper electrode on the second capacitor dielectric; and
a support structure comprised of an insulating material connecting the upper end of the first tubular lower electrode with the upper end of the second tubular lower electrode, the support structure contacting a first side of the first tubular lower electrode and a first side of the second tubular lower electrode,
wherein the lower end of the first lower tubular electrode connects opposite sides of the first lower tubular electrode, wherein the top surface and the bottom surface of the lower end are located within the first opening and are lower than a top surface of the insulation layer.

23. The semiconductor device of claim 22, wherein a top surface of the second contact is lower than a top surface of the etch stop layer.

24. The semiconductor device of claim 23, wherein top surfaces of the first and second contacts are lower than the top surface of the insulation layer.

25. The semiconductor device of claim 22, wherein the first and second contacts are first and second contact lines, respectively.

26. The semiconductor device of claim 22, wherein the first and second contacts are first and second contact plugs, respectively.

27. The semiconductor device of claim 22,
further comprising first and second memory cell access transistors,
wherein the first and second contacts are respectively connected to the first and second memory cell access transistors.

28. A semiconductor device, comprising:
a semiconductor substrate;
a plurality of capacitors arranged in a plurality of rows extending in a first direction, capacitors of a row being staggered with respect to capacitors of immediately neighboring rows, each of the plurality of capacitors comprising a tubular lower electrode extending away from the semiconductor substrate in a vertical direction perpendicular to the first direction, a capacitor dielectric on the first tubular lower electrode and an upper electrode on the capacitor dielectric;
a first support structure comprised of an insulating material connecting upper portions of the tubular lower electrodes of a first group of the plurality of capacitors to each other, the first support structure contacting external sides of the tubular lower electrodes of the first group of the plurality of capacitors,
wherein the first group of the plurality of capacitors comprises capacitors of at least three rows,
wherein the first support structure extends in a direction at an acute angle with respect to the first direction,
wherein the first support structure is integral,
wherein the plurality of capacitors are regularly distributed across a first area over the semiconductor substrate, the first area including a first border extending in the first direction and a second border extending in a second direction, the second direction being perpendicular to the first direction,
wherein the first border and the second border are borders for an array of capacitors, including the plurality of capacitors, such that capacitors are not located adjacent the first border and the second border outside the first area.

29. The semiconductor device of claim 28, comprising:
a plurality of integral support structures, including the first support structure, each support structure comprised of an insulating material contacting and connecting to each other upper portions of the tubular lower electrodes of a corresponding group of the plurality of capacitors, each group comprising capacitors of at least three rows, and
wherein each support structure extends in the direction at the acute angle with respect to the first direction.

* * * * *